United States Patent
Inoue et al.

(10) Patent No.: US 11,677,253 B2
(45) Date of Patent: Jun. 13, 2023

(54) MONITORING DEVICE, MONITORING METHOD, COMPUTER PROGRAM, DETERIORATION DETERMINATION METHOD, DETERIORATION DETERMINATION DEVICE, AND DETERIORATION DETERMINATION SYSTEM

(71) Applicant: GS Yuasa International Ltd., Kyoto (JP)

(72) Inventors: Tatsuya Inoue, Kyoto (JP); Kayo Yamasaki, Kyoto (JP); Yuya Kihira, Kyoto (JP); Hitoshi Matsushima, Kyoto (JP); Keita Nakai, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 106 days.

(21) Appl. No.: 16/961,662

(22) PCT Filed: Jan. 10, 2019

(86) PCT No.: PCT/JP2019/000421
§ 371 (c)(1),
(2) Date: Jul. 10, 2020

(87) PCT Pub. No.: WO2019/142711
PCT Pub. Date: Jul. 25, 2019

(65) Prior Publication Data
US 2020/0403415 A1 Dec. 24, 2020

(30) Foreign Application Priority Data

Jan. 16, 2018 (JP) .............................. JP2018-005045
Mar. 14, 2018 (JP) .............................. JP2018-047053

(51) Int. Cl.
*H02J 7/00* (2006.01)
*G06N 20/00* (2019.01)
*H01M 10/48* (2006.01)

(52) U.S. Cl.
CPC .............. *H02J 7/005* (2020.01); *G06N 20/00* (2019.01); *H01M 10/48* (2013.01); *H02J 7/0018* (2013.01); *H02J 7/0048* (2020.01)

(58) Field of Classification Search
CPC ........ H02J 7/005; H02J 7/0018; H02J 7/0048; H02J 7/0016; G06N 20/00; G01R 31/392;
(Continued)

(56) References Cited

U.S. PATENT DOCUMENTS 10,746,804 B2 * 8/2020 Park ..................... G01R 31/389
11,171,498 B2 * 11/2021 Chemali .............. G06N 3/0445
(Continued)

FOREIGN PATENT DOCUMENTS

EP 3 048 451 A1 7/2016
EP 3 125 354 A1 2/2017
(Continued)

OTHER PUBLICATIONS

Extended European Search Report dated Feb. 12, 2021 for European Patent Application No. 19741059.0-1010.
(Continued)

*Primary Examiner* — Nha T Nguyen
(74) *Attorney, Agent, or Firm* — McGinn I.P. Law Group, PLLC

(57) ABSTRACT

A monitoring device includes: an acquisition unit configured to acquire information regarding whether a learning model is in a first mode or in a second mode, the learning model configured to detect a state of an energy storage device; and a change unit configured to change an operation of a balancer circuit from a predetermined state in a case where (Continued)

the learning model is in the first mode, the balancer circuit configured to balance a voltage of the energy storage device.

19 Claims, 15 Drawing Sheets

(58) Field of Classification Search
CPC .... G01R 31/396; G01R 31/367; G01R 31/36; Y02E 60/10; H01M 10/44; H01M 10/48
See application file for complete search history.

(56) References Cited

U.S. PATENT DOCUMENTS

| | | | |
|---|---|---|---|
| 2008/0234956 A1 | 9/2008 | Mizuno et al. | |
| 2010/0066379 A1 | 3/2010 | Iida | |
| 2011/0054815 A1* | 3/2011 | Xu | G01R 31/367 320/132 |
| 2013/0091083 A1* | 4/2013 | Frisch | G06N 20/00 706/14 |
| 2014/0021924 A1 | 1/2014 | Abe et al. | |
| 2015/0162759 A1* | 6/2015 | Fujii | G01R 35/00 320/118 |
| 2015/0372514 A1 | 12/2015 | Kobayashi | |
| 2016/0239759 A1* | 8/2016 | Sung | H01M 10/48 |
| 2017/0294689 A1* | 10/2017 | Wada | G01R 31/382 |
| 2021/0004720 A1* | 1/2021 | Henri | G06N 20/00 |
| 2021/0055353 A1* | 2/2021 | Yazami | G01R 31/367 |
| 2021/0190877 A1* | 6/2021 | Isa | G01R 31/3648 |

FOREIGN PATENT DOCUMENTS

| | | |
|---|---|---|
| JP | H09-243716 A | 9/1997 |
| JP | H09-281203 A | 10/1997 |
| JP | 2003-249271 A | 9/2003 |
| JP | 2006-101699 A | 4/2006 |
| JP | 2008-118777 A | 5/2008 |
| JP | 2008-232758 A | 10/2008 |
| JP | 2010-519691 A | 6/2010 |
| JP | 2011-072169 A | 4/2011 |
| JP | 2014-110692 A | 6/2014 |
| JP | 2014-160039 A | 9/2014 |
| JP | 2015-121520 A | 7/2015 |
| JP | 2017-073371 A | 4/2017 |
| WO | WO 2008/053969 A1 | 5/2008 |
| WO | WO 2012/165629 A1 | 12/2012 |
| WO | WO 2014/122832 A1 | 8/2014 |
| WO | WO 2015/198631 A1 | 12/2015 |

OTHER PUBLICATIONS

International Search Report (ISR) (PCT Form PCT/ISA/210), in PCT/JP2019/000421, dated Mar. 16, 2019.

* cited by examiner

Fig. 6

| Case | Mode of learning model | State of balancer circuit | Operation of battery management unit |
|---|---|---|---|
| 1 | Learning mode | Increase threshold voltage that causes balancer circuit to balance voltage | Acquire data including voltage and temperature of energy storage cells, and provide data to learning model |
| 2 | Learning mode | Stopped operation state | Acquire data including voltage and temperature of energy storage cells, and provide data to learning model |
| 3 | Learning mode | Cause energy storage cell having minimum voltage to discharge | Acquire data including voltage and temperature of energy storage cells, and provide data to learning model |
| 4 | Detection mode | Normal operation state | Acquire data including voltage and temperature of energy storage cells, and provide data to learning model |
| 5 | Detection mode | Any one of states in cases 1, 2, and 3 | Acquire data including voltage and temperature of energy storage cells, and provide data to learning model |

Fig. 7

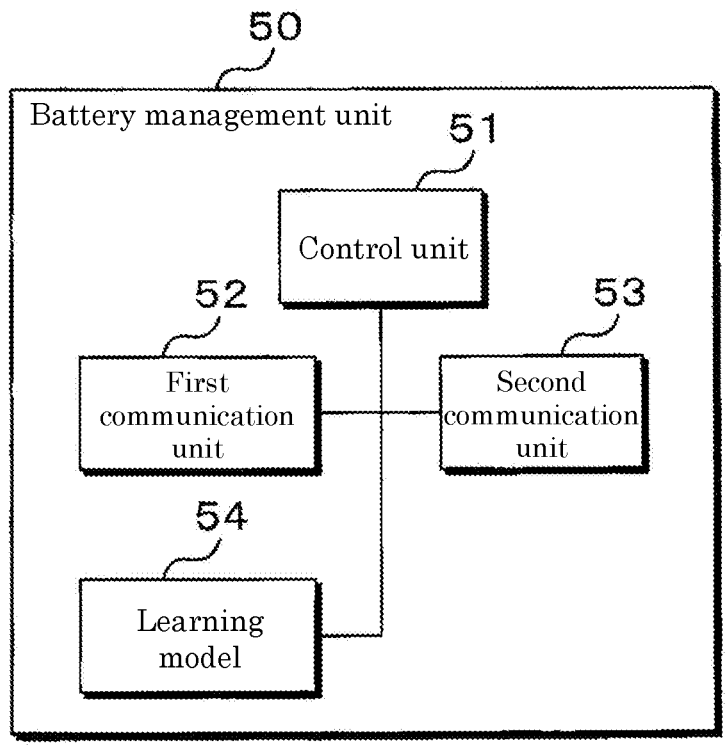

MONITORING DEVICE, MONITORING METHOD, COMPUTER PROGRAM, DETERIORATION DETERMINATION METHOD, DETERIORATION DETERMINATION DEVICE, AND DETERIORATION DETERMINATION SYSTEM

TECHNICAL FIELD

An aspect of the present invention relates to a monitoring device, a monitoring method, and a computer program.

BACKGROUND ART

An energy storage device is widely used in an uninterruptible power system, a DC power supply or an AC power supply included in a stabilized power supply, and the like. Further, the energy storage device is expansively used in a large-scale system for storing renewable energy or electric power generated in an existing power generating system.

An energy storage module has a configuration where energy storage cells are connected in series. An energy storage cell is known to deteriorate progressively as a result of repeated charge-discharge cycles. Patent Document 1 discloses a technique configured, based on a database for storing a predicted value of deterioration rate in accordance with a plurality of usage conditions of a storage battery and based on data for a usage condition and a deterioration rate of a storage battery that is actually in operation, to predict a service life of the storage battery (that is actually in operation).

In the energy storage module where the energy storage cells are connected in series, each of the energy storage cells has a difference from others of the energy storage cells, such as a difference in self discharge during the charge-discharge or a difference in speed of deterioration during the usage. As a result, the energy storage cells exhibit a variation in voltage or a variation in state of charge. Patent Document 2 discloses a technique to balance the variation in voltage or the variation in state of charge between the energy storage cells.

PRIOR ART DOCUMENTS

Patent Documents

Patent Document 1: JP-A-2015-121520
Patent Document 2: JP 5573075 B2

SUMMARY OF THE INVENTION

Problems to be Solved by the Invention

It is desired to grasp at an early stage a degree of deterioration or an abnormal state of an energy storage cell (energy storage module) that is provided in a mobile object or a facility. In view of this, a possibility of employing artificial intelligence (hereinafter, referred to as "A") techniques is explored.

An aspect of the present invention provides a monitoring device, a monitoring method, and a computer program, each employing A techniques.

Another aspect of the present invention provides a deterioration determination method, a deterioration determination device, and a deterioration determination system, each configured to detect at the early stage an energy storage device that deteriorates relatively quickly.

Means for Solving the Problems

A monitoring device configured to monitor an energy storage device includes: an acquisition unit configured to acquire information regarding whether a learning model is in a first mode or in a second mode, the learning model configured to detect a state of the energy storage device; and a change unit configured to change an operation of a balancer circuit from a predetermined state, the balancer circuit configured to balance a voltage of the energy storage device, in a case where the learning model is in the first mode.

A monitoring method configured to monitor an energy storage device includes steps of acquiring information regarding whether a learning model is in a first mode or in a second mode, the learning model configured to detect a state of the energy storage device; and changing an operation of a balancer circuit from a predetermined state in a case where the learning model is in the first mode, the balancer circuit configured to balance a voltage of the energy storage device.

The acquisition unit acquires the information regarding whether the learning model configured to detect the state of the energy storage device is in the first mode or in the second mode. The first mode may be a mode to create teaching data, a mode to create correct answer data, or a learning mode. The second mode may be the learning mode or a detection mode (a mode to actually detect the state of the energy storage device based on the learning model that has learned). In the case where the learning model is in the first mode, the change unit changes the operation of the balancer circuit configured to balance the voltage of the energy storage device from the predetermined state.

The predetermined state may correspond to a normal operational state of the balancer circuit. For example, when a voltage difference between a plurality of energy storage cells (e.g., a difference between a maximum voltage and a minimum voltage among respective voltages of the plurality of energy storage cells) is equal to or more than a threshold voltage, the balancer circuit may balance the voltages of the plurality of energy storage cells. A change from the predetermined state may correspond to a restriction on the operation of the balancer circuit. The restriction includes, for example: (1) increasing the threshold voltage that causes the balancer circuit to start the operation, so as to prevent the balancer circuit from balancing the voltages until the voltage difference between the plurality of energy storage cells further increases to be larger than in the normal state; and (2) stopping the operation of the balancer circuit to prevent the balancer circuit from balancing the voltages.

With the configuration described above, in a case where the learning model (configured to detect the state of the energy storage device) is caused to learn, it is possible to change a degree, to which the voltage or a state of charge of the energy storage device is automatically adjusted, in accordance with the operation of the balancer circuit. Accordingly, it is possible to acquire data reflecting an actual state of an energy storage device that has deteriorated or an energy storage device that is turning into an abnormal state.

In order to cause an A to learn (particularly, machine learning), it is desirable to collect a lot of data including data regarding an energy storage device in a normal state and data regarding the energy storage device that has deteriorated. However, it is not easy to obtain the data regarding the energy storage device that has deteriorated. Cost and time are required to experimentally create the energy storage device that has deteriorated. When collecting data from an energy storage device that is provided and actually used in a mobile object or a facility, the energy storage device that has deteriorated exhibits a same behavior as the energy storage device in the normal state (e.g., a behavior in voltage or a behavior in temperature, each detected by a sensor) due to the operation of the balancer circuit in an energy storage module. The change unit described above changes the operation of the balancer circuit from the predetermined state. As a result, it is possible to efficiently collect the data regarding the energy storage device that has deteriorated or the energy storage device that is turning into the abnormal state.

In the case where the learning model is in the first mode, the change unit may change a threshold voltage that causes the balancer circuit to balance the voltage to a larger value. With this configuration, it is easier to identify the energy storage device that has deteriorated or the energy storage device that is turning into the abnormal state, each exhibiting any different behavior from the energy storage device in the normal state.

In the case where the learning model is in the first mode, the change unit may change the operation of the balancer circuit to a stopped state. With this configuration, it is easier to identify the energy storage device that has deteriorated or the energy storage device that is turning into the abnormal state, each exhibiting any different behavior from the energy storage device in the normal state.

In the case where the learning model is in the first mode, the change unit causes one of a plurality of energy storage cells to discharge in order to increase a voltage difference between the plurality of energy storage cells. For example, the change unit causes one of the plurality of energy storage cells exhibiting a minimum voltage to discharge. As a result, the voltage of the energy storage cell exhibiting the minimum voltage is decreased, and a state of charge of the corresponding energy storage cell is decreased. Accordingly, it is possible to simulate the energy storage cell that has deteriorated or the energy storage cell that is turning into the abnormal state.

In a case where the learning model is in the second mode, the change unit may cause the balancer circuit to operate in the predetermined state. For example, in the detection mode where the learning model that has learned actually detects the state of the energy storage device, the change unit may cause the balancer circuit to operate in the predetermined state (e.g., the normal operational state).

With this configuration, it is possible to accurately grasp a degree of the deterioration or abnormality of the energy storage device (energy storage cell/energy storage module) that is provided in the mobile object or the facility, based on the data acquired in actual usage conditions of the energy storage device (energy storage cell/energy storage module) that is provided therein. The learning model has learned the data regarding the energy storage device that has deteriorated or the energy storage device that is turning into the abnormal state, each exhibiting any different behavior from the energy storage device in the normal state. Thus, the learning model instantly detects the deteriorated state or the abnormal state of the energy storage device.

In the case where the learning model is in the second mode, the change unit may change the operation of the balancer circuit from the predetermined state. For example, in the detection mode where the learning model that has learned actually detects the state of the energy storage device, the change unit may change the operation of the balancer circuit from the predetermined state (e.g., impose the restriction on the balancer circuit) to check an output of the learning model. With this configuration, it is possible to verify whether or not the learning model is valid.

Under the actual usage conditions of the energy storage device that is provided in the mobile object or the facility it is possible to detect the state of the energy storage device in a state where the energy storage device that has deteriorated or the energy storage device that is turning into the abnormal state is made apparent.

The acquisition unit may acquire from a server the information regarding whether the learning model is in the first mode or in the second mode. With this configuration, in a large-scale system including a large number of the monitoring devices, operations of these monitoring devices are remotely managed on an individual basis and on a collective basis. The monitoring device may include the learning model. The learning model may output the state of the energy storage device based on input data including the voltage and the temperature of the energy storage device. The learning model includes, for example, an algorithm for machine learning such as deep learning. With this configuration, the monitoring device monitors the energy storage device (energy storage cell/energy storage module) and instantly detects the deteriorated state or the abnormal state of the energy storage device (energy storage cell/energy storage module).

A deterioration determination method according to another aspect of the present invention includes steps of: stopping energizing an energy storage device unit including a plurality of energy storage devices; stopping balancing voltages between the plurality of energy storage devices; acquiring a temporal change in voltage of each of the plurality of energy storage devices; and determining whether or not any one of the plurality of energy storage devices has deteriorated quickly based on the acquired temporal change in voltage of each of the plurality of energy storage devices. An energy storage cell or an energy storage module may correspond to the energy storage device, and the energy storage module or a bank as will be described later may correspond to the energy storage device unit.

When the energy storage module includes an energy storage cell that has deteriorated relatively quickly (hereinafter, referred to as an energy storage cell that has deteriorated), the energy storage cell that has deteriorated restricts a performance of the energy storage module. Further, the energy storage cell that has deteriorated affects an overall performance of an energy storage system where the energy storage module is installed. Accordingly in order to maintain the performance of the energy storage system, it is desirable to detect at an early stage the energy storage cell that has deteriorated. However, even an energy storage cell that deteriorates relatively quickly shows slow deterioration at an initial stage. When the system functions to balance the voltages or states of charge between the plurality of energy storage cells, a difference in behavior between the energy storage cell that has deteriorated and an energy storage cell in a normal state is reduced, and thus it is difficult to detect the energy storage cell that has deteriorated. In a case of failing to detect the energy storage cell that has deteriorated at the early stage and resulting in apparent degradation of the energy storage system, the cause investigation may take longer, thereby requiring a prolonged stoppage of the energy storage system.

With the configuration described above, it is possible to determine whether or not each of the energy storage devices has deteriorated more smoothly than in a conventional configuration. It is thus possible to detect at the early stage any one of the energy storage devices that has deteriorated. Accordingly, it is possible to remove any one of the energy storage devices that has deteriorated before the performance of the energy storage system significantly degrades.

BRIEF DESCRIPTION OF THE DRAWINGS

FIG. 6 is a diagram showing an example of a control operation of the battery management unit.

FIG. 7 is a block diagram showing another example of the configuration of the battery management unit.

MODE FOR CARRYING OUT THE INVENTION

First Embodiment

Figure 1:
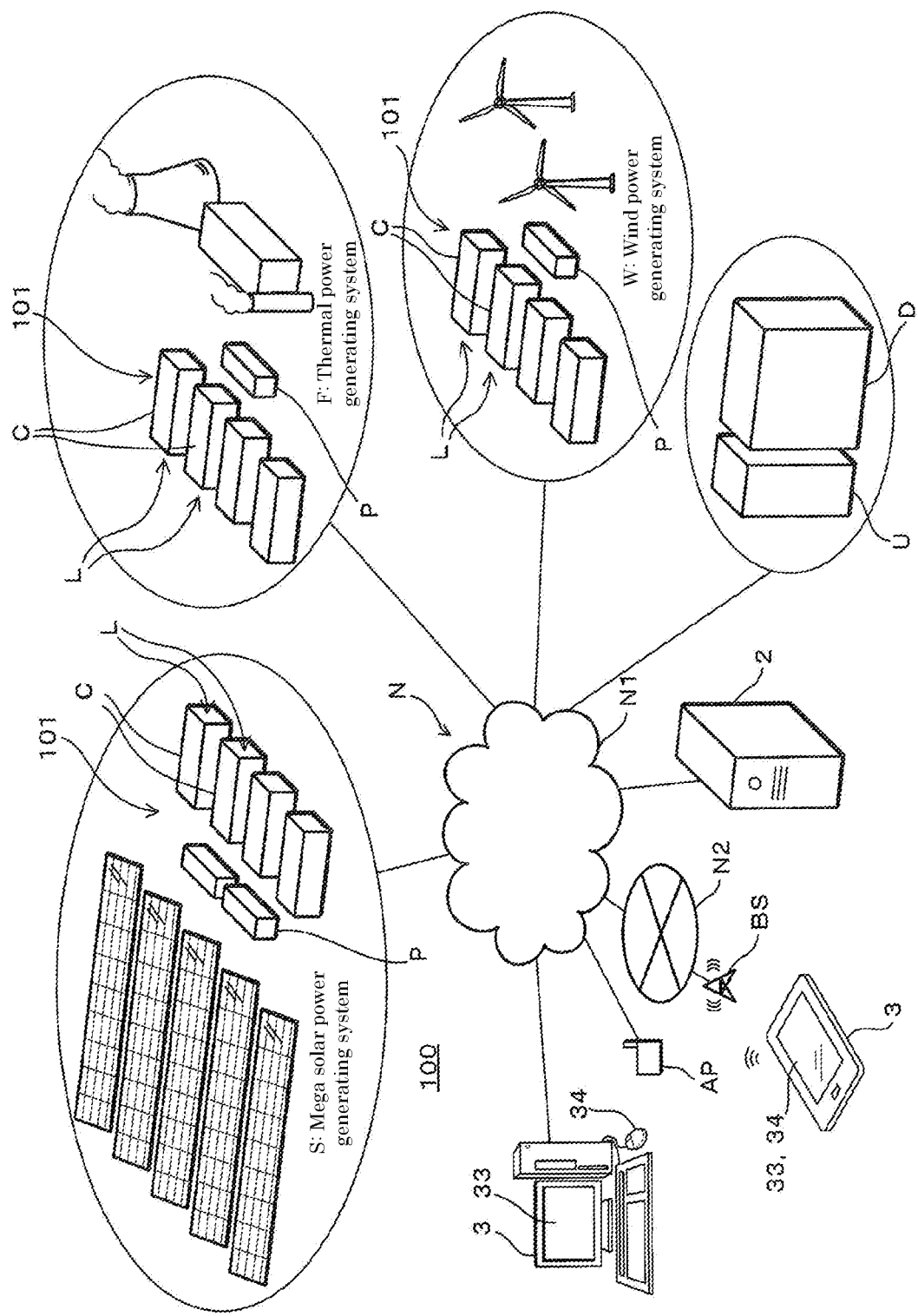
FIG. 1 is a diagram illustrating a schematic configuration of a remote monitoring system.

Hereinafter, a monitoring device according to this embodiment will be described with reference to the drawings. FIG. 1 is a diagram illustrating a schematic configuration of a remote monitoring system (deterioration determination system) 100 according to this embodiment. As illustrated in FIG. 1, a network N includes a public communication network (such as the Internet) N1, and a carrier network N2 configured to provide wireless communication based on mobile communication standard. The network N is connected to a thermal power generating system F, a mega solar power generating system S, and a wind power generating system W, an uninterruptible power system (UPS) U, a rectifier (a DC power supply or an AC power supply) D arranged in a stabilized power supply system for railways, and the like. Further, the network N is connected to a communication device 1, a server device 2, and a client device 3, as will be described later. The server device 2 is configured to collect information from the communication device 1, and the client device 3 is configured to acquire the information collected.

The carrier network N2 includes a base station BS. The client device 3 communicates with the server device 2 from the base station BS via the network N. The public communication network N1 is connected to an access point AP. The client device 3 transmit/receives the information to/from the server device 2 via the access point AP and the network N.

Each of the mega solar power generating system S, the thermal power generating system F, and the wind power generating system W is installed along with a power conditioning system P and an energy storage system 101. The energy storage system 101 includes a plurality of containers C, in each of which an energy storage module group L is accommodated. The plurality of containers C are arranged and aligned with each other. The energy storage module group L has a hierarchical configuration including, for example, a plurality of energy storage cells, a plurality of energy storage modules, a plurality of banks, and a domain. In the hierarchical configuration, the plurality of energy storage cells are connected in series in each of the plurality of energy storage modules; the plurality of energy storage modules are connected in series in each of the plurality of banks; and the plurality of banks are connected in parallel in the domain. An energy storage device is preferably a secondary battery such as a lead-acid battery and a lithium ion battery or a rechargeable battery such as a capacitor. Some of the energy storage devices may be a non-rechargeable primary battery.

Figure 2:
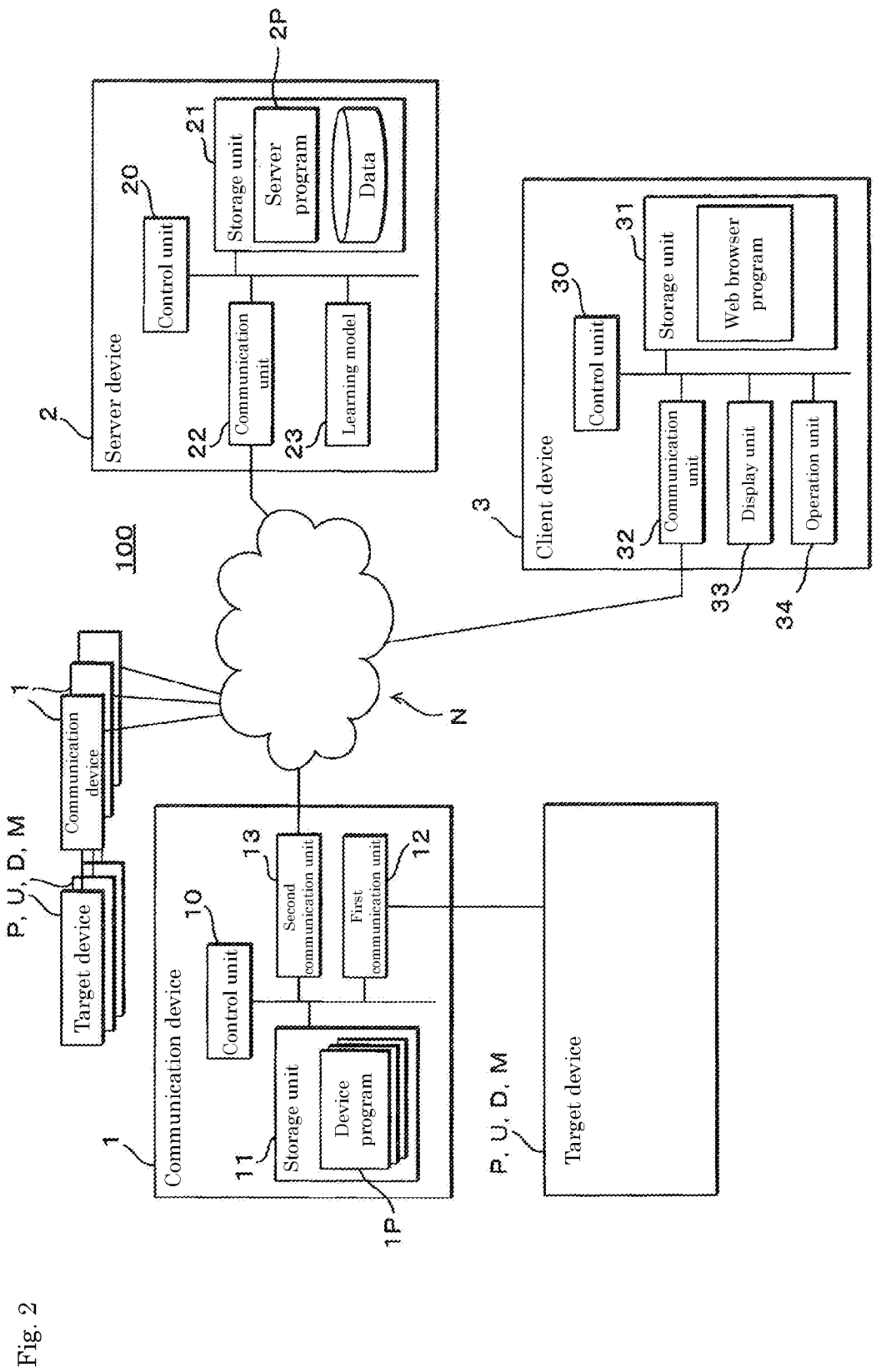
FIG. 2 is a block diagram showing an example of a configuration of the remote monitoring system.

FIG. 2 is a block diagram showing an example of a configuration of the remote monitoring system 100. The remote monitoring system 100 includes the communication device 1, the server device 2, the client device 3, and a battery management unit 50. The battery management unit 50 (see FIG. 3) functions as a monitoring device as will be described later.

As shown in FIG. 2, the communication device 1 is connected to the network N, and is concurrently connected to each of target devices P, U, D, and M. The target devices P, U, D, and M respectively correspond to the power conditioning system P, the uninterruptible power system U, the rectifier D, and a management device M as will be described later. Note that, the battery management unit 50 may be included in the management device M as a remote monitoring target.

The remote monitoring system 100 uses the communication device 1, to which each of the target devices P, U, D, and M is connected, to monitor a state of each of the energy storage modules (energy storage cells) in the energy storage system 101. The state of each of the energy storage modules (energy storage cells) is, for example, a voltage, a current, a temperature, a state of charge (SOC). The remote monitoring system 100 displays the state of each of the energy storage cells detected (including a deteriorated state, an abnormal state, or the like), so as to cause a user or an operator (maintenance staff to confirm the state.

The communication device 1 includes a control unit 10, a storage unit 11, a first communication unit 12 and a second communication unit 13. The control unit 10 is a central processing unit (CPU) or the like, and uses a read only memory (ROM) built in, a random access memory (RAM) built in, and the like to control overall of the communication device 1.

The storage unit 11 is, for example, a non-volatile memory such as a flash memory. The storage unit 11 stores a device program 1P that the control unit 10 is configured to read and execute. The storage unit 11 stores information collected in processes that the control unit 10 has executed, such as an eventlog.

The first communication unit 12 is a communication interface to provide communication with the target devices P, U, D, and M. The first communication unit 12 is, for example, a serial communication interface such as RS-232C or RS-485.

The second communication unit 13 is a communication interface to provide the communication via the network N. The second communication unit 13 is, for example, a communication interface such as Ethernet (registered trademark) or a wireless communication antenna. The control unit 10 communicates with the server device 2 via the second communication unit 13.

The server device 2 includes a control unit 20, a storage unit 21, a communication unit 22, a learning model 23, and the like. The server device 2 may be a single server computer, but is not limited thereto. The server device 2 may include a plurality of server computers.

The control unit 20 may be, for example, a CPU, and uses a memory such as a ROM built in, a RAM built in, and the like to control overall of the server device 2. The control unit 20 may be a CPU, a graphics processing unit (GPU), a multi-core CPU, or a tensor processing unit (TPU). The control unit 20 executes information processing based on a server program 2P stored in the storage unit 21. The server program 2P includes a web server program, and the control unit 20 functions as a web server to provide a web page to the client device 3 and to accept a login from the client device 3 to a web service. Based on the server program 2P, the control unit 20 may also be a simple network management protocol (SNMP) server to collect the information from the communication device 1.

The storage unit 21 may be a non-volatile memory such as a hard disk or a flash memory. The storage unit 21 stores data collected in processes that the control unit 20 has executed, the data including a state of each of the target devices P, U, D, and M to be monitored.

The communication unit 22 is a communication device to transmit/receive communication and data to/from systems connected via the network N. More specifically the communication unit 22 is a network card for communications via the network N.

The learning model 23 collects input data from each of the target devices P, U, D, and M via the communication device 1, the input data including the voltage and the temperature of each of the energy storage cells. Based on the input data, the learning model 23 outputs the state of each of the energy storage cells including the deteriorated state or the abnormal state. The learning model 23 includes, for example, an algorithm for machine learning such as deep learning. The learning model 23 may be a quantum computer.

The client device 3 may be a computer for an administrator of the energy storage system 101 of the mega solar power generating system S and the thermal power generating system F, or the operator such as the maintenance staff of the target devices P, U, D, and M. The client device 3 may be a desktop or laptop personal computer, or may be a communication terminal such as a smartphone or a tablet.

The client device 3 includes a control unit 30, a storage unit 31, a communication unit 32, a display unit 33, and an operation unit 34.

The control unit 30 is a CPU processor. The control unit 30 uses a web browser program stored in the storage unit 31 to cause the display unit 33 to display the web page provided by the server device 2 or the communication device 1.

The storage unit 31 is a non-volatile memory such as a hard disk or a flash memory. The storage unit 31 stores various programs including the web browser program.

The communication unit 32 may be a communication device such as a network card for wired communication, a wireless communication device for the mobile communication connected to the base station BS (see FIG. 1), or a wireless communication device used to be connected to the access point AP. The control unit 30 causes the communication unit 32 to communicate with or transmit/receive the information to/from the server device 2 or the communication device 1 via the network N.

The display unit 33 may be a display such as a liquid crystal display or an organic electro luminescence (EL) display. The control unit 30 executes processes based on the web browser program, and as a result, the display unit 33 displays an image of the web page that the server device 2 provides.

The operation unit 34 is a user interface, such as a keyboard, a pointing device, or a voice input unit, for inputting/outputting to/from the control unit 30. The operation unit 34 may be a touch panel on the display unit 33, or a physical button provided in a housing. The operation unit 34 informs the control unit 20 of information regarding an operation by the user.

Figure 3:
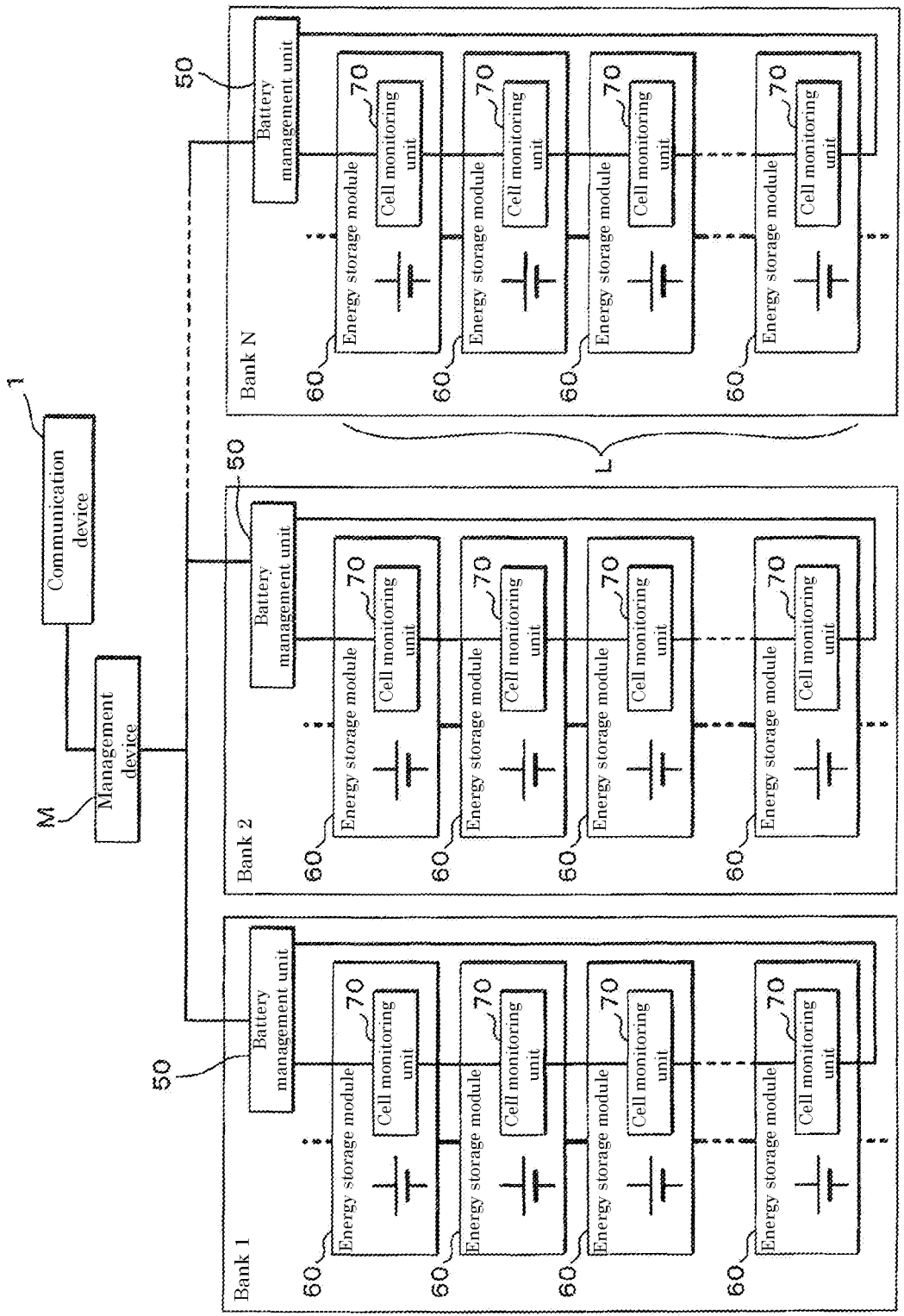
FIG. 3 is a diagram showing an example of a connected state of a communication device.

FIG. 3 is a diagram showing an example of a connected state of the communication device 1. As shown in FIG. 3, the communication device 1 is connected to the management device M. The management device M is connected to the battery management unit 50 as a monitoring device provided in each of banks #1 to #N. Note that, the communication device 1 may be a terminal device (measurement monitor) that communicates with the battery management unit 50 to receive information regarding each of the energy storage devices. Alternatively, the communication device 1 may be a network card communication device connectable to a power supply device.

Each of the banks #1 to #N includes a plurality of energy storage modules 60, and each of the energy storage modules 60 includes a cell monitoring unit 70. The cell monitoring unit 70 has communication functions and is internally installed in each of the energy storage modules 60. In each of the banks #1 to #N, the battery management unit 50 communicates with the cell monitoring unit 70 via the serial communication. Concurrently the battery management unit 50 transmit/receives information to/from the management device M. The management device M integrates the information from the battery management unit 50 in each of the banks #1 to #N in the domain, and outputs the information integrated to the communication device 1.

Figure 4:
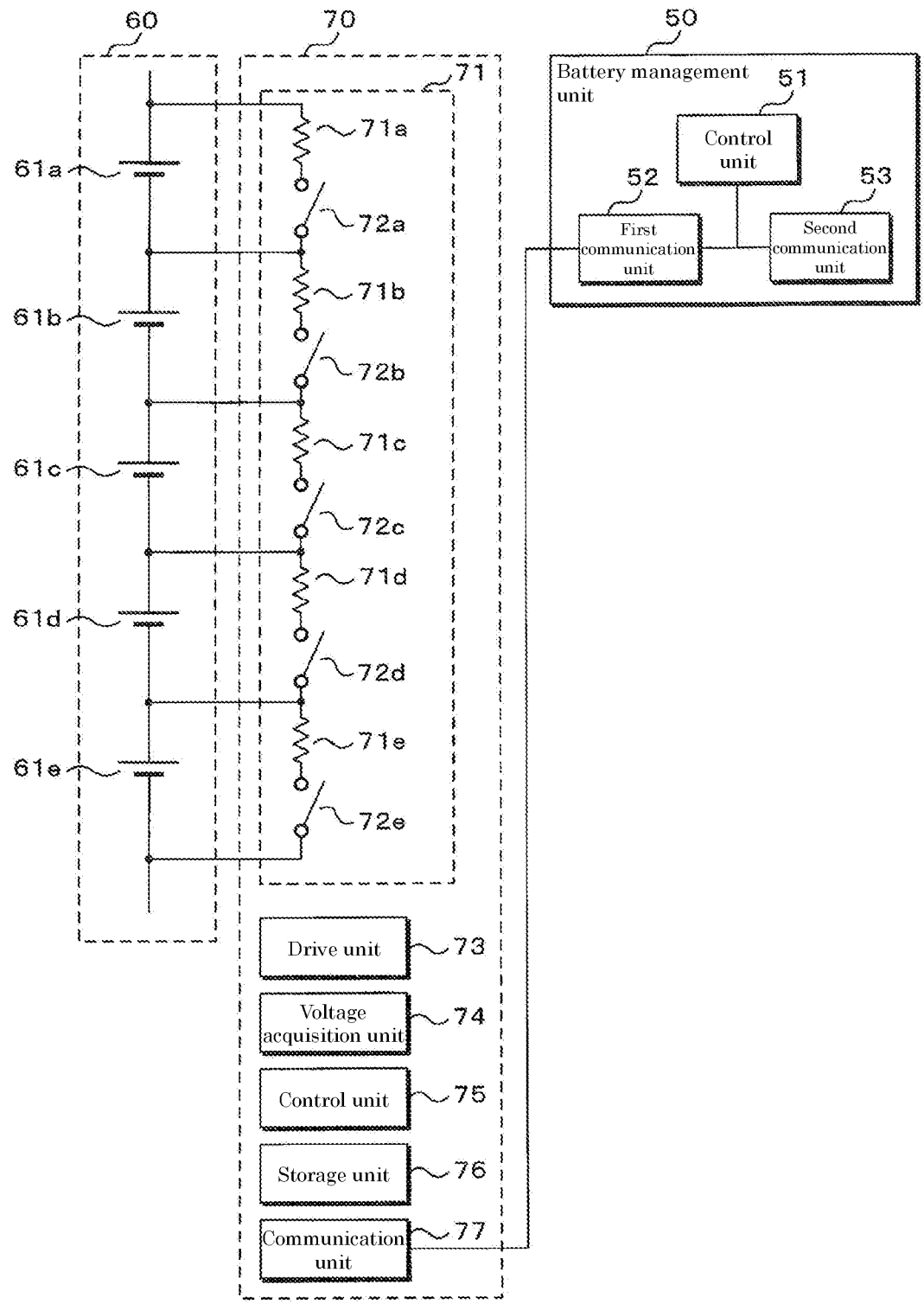
FIG. 4 is a block diagram showing an example of a configuration of a cell monitoring unit and a battery management unit.

FIG. 4 is a block diagram showing an example of a configuration of the cell monitoring unit 70 and the battery management unit 50. The cell monitoring unit 70 includes a balancer circuit 71, a drive unit 73, a voltage acquisition unit 74, a control unit 75, a storage unit 76, a communication unit 77, and the like. Each of the energy storage modules 60 has a plurality of energy storage cells 61$a$, 61$b$, 61$c$, 61$d$, and 61$e$, each connected in series to the others. In FIG. 4, the number of the energy storage cells connected in series is five only for convenience of description. Thus, the number of energy storage cells included in energy storage module 60 is not limited to five.

The balancer circuit 71 includes a series circuit of a resistor 71a and a switch 72a, a series circuit of a resistor 71b and a switch 72b, a series circuit of a resistor 71c and a switch 72c, a series circuit of a resistor 71d and a switch 72d, and a series circuit of a resistor 71e and a switch 72e. The series circuit of the resistor 71a and the switch 72a is connected in parallel to the energy storage cell 61a; the series circuit of the resistor 71b and the switch 72b is connected in parallel to the energy storage cell 61b; the series circuit of the resistor 71c and the switch 72c is connected in parallel to the energy storage cell 61c; the series circuit of the resistor 71d and the switch 72d is connected in parallel to the energy storage cell 61d; and the series circuit of the resistor 71e and the switch 72e is connected in parallel to the energy storage cell 61e. Each of the switches 72a to 72e is, for example, a field effect transistor (FET), or may be a relay.

The drive unit 73 drives each of the switches 72a to 72e to be on or off. When each of the switches 72a to 72e is the FET, the drive unit 73 outputs a gate signal to a gate of the FET to turn the FET on and off.

The voltage acquisition unit 74 acquires a voltage of each of the energy storage cells 61a to 61e.

The storage unit 76 stores a threshold voltage predetermined.

The control unit 75 identifies a maximum voltage and a minimum voltage among the respective voltages of the energy storage cells 61a to 61e that the voltage acquisition unit 74 has acquired. When a voltage difference between the maximum voltage and the minimum voltage is equal to or more than the threshold voltage, the control unit 75 turns on the switch connected in parallel to the energy storage cell exhibiting the maximum voltage, so as to cause the energy storage cell (exhibiting the maximum voltage) to discharge via the resistor. As a result, the voltage (state of charge) of the energy storage cell (exhibiting the maximum voltage) is decreased. With this configuration, the voltages (states of charge) between the energy storage cells 61a to 61e are balanced.

The communication unit 77 has a function of proceeding with, for example, the serial communication between the battery management unit 50 and a first communication unit 52.

The battery management unit 50 includes a control unit 51, the first communication unit 52, a second communication unit 53, and the like.

The first communication unit 52 has a function of proceeding with, for example, the serial communication with the communication unit 77 of the cell monitoring unit 70.

The second communication unit 53 has a function of transmitting/receiving the information to/from the communication device 1. More specifically, the second communication unit 53 has a function as an acquisition unit. The second communication unit 53 acquires from the server device 2 information regarding whether the learning model 23 (for detecting the state of each of the energy storage cells) shifts to a learning mode or a detection mode. With this configuration, in a large-scale system including a large number of the battery management units 50, operations of the battery management units 50 are remotely managed on an individual basis and on a collective basis.

The detection mode (also referred to as an operational mode) is a mode where the learning model 23 that has learned is used to actually detect the state of each of the energy storage cells. In this embodiment, the server device 2 includes the learning model 23, but the present invention is not limited thereto, and other devices may include the learning model 23.

The control unit 51 may be a CPU or the like. The control unit 51 has a function as a change unit. In a case where the learning model 23 of the server device 2 shifts to the learning mode, the control unit 51 controls to change an operation of the balancer circuit 71 (configured to balance the voltages of the plurality of energy storage cells) from a predetermined state.

The predetermined state may correspond to a normal operational state of the balancer circuit 71. For example, when the voltage difference between the plurality of energy storage cells 61a to 61e (e.g., the difference between the maximum voltage and the minimum voltage among the respective voltages of the energy storage cells 61a to 61e) is equal to or more than the threshold voltage, the balancer circuit 71 may be in a state to balance the voltages. A change from the predetermined state above may correspond to a restriction on the operation of the balancer circuit 71. The restriction includes, for example: (1) increasing the threshold voltage that causes the balancer circuit 71 to start the operation, so as to prevent the balancer circuit 71 from balancing the voltages until the voltage difference between the plurality of energy storage cells further increases to be larger than in the normal state; and (2) stopping the operation of the balancer circuit 71 to prevent the balancer circuit 71 from balancing the voltages. The operation of the control unit 51 to control the balancer circuit 71 will be described in detail later.

With the configuration described above, in a case where the learning model 23 (configured to detect the state of each of the energy storage cells) is caused to learn, it is possible to change a degree, to which the voltage or the state of charge of each of the energy storage cells is automatically adjusted, in accordance with the operation of the balancer circuit 71. Accordingly, it is possible to acquire data reflecting an actual state of each of the energy storage cell that has deteriorated and the energy storage cell that is turning into the abnormal state.

Figure 5:
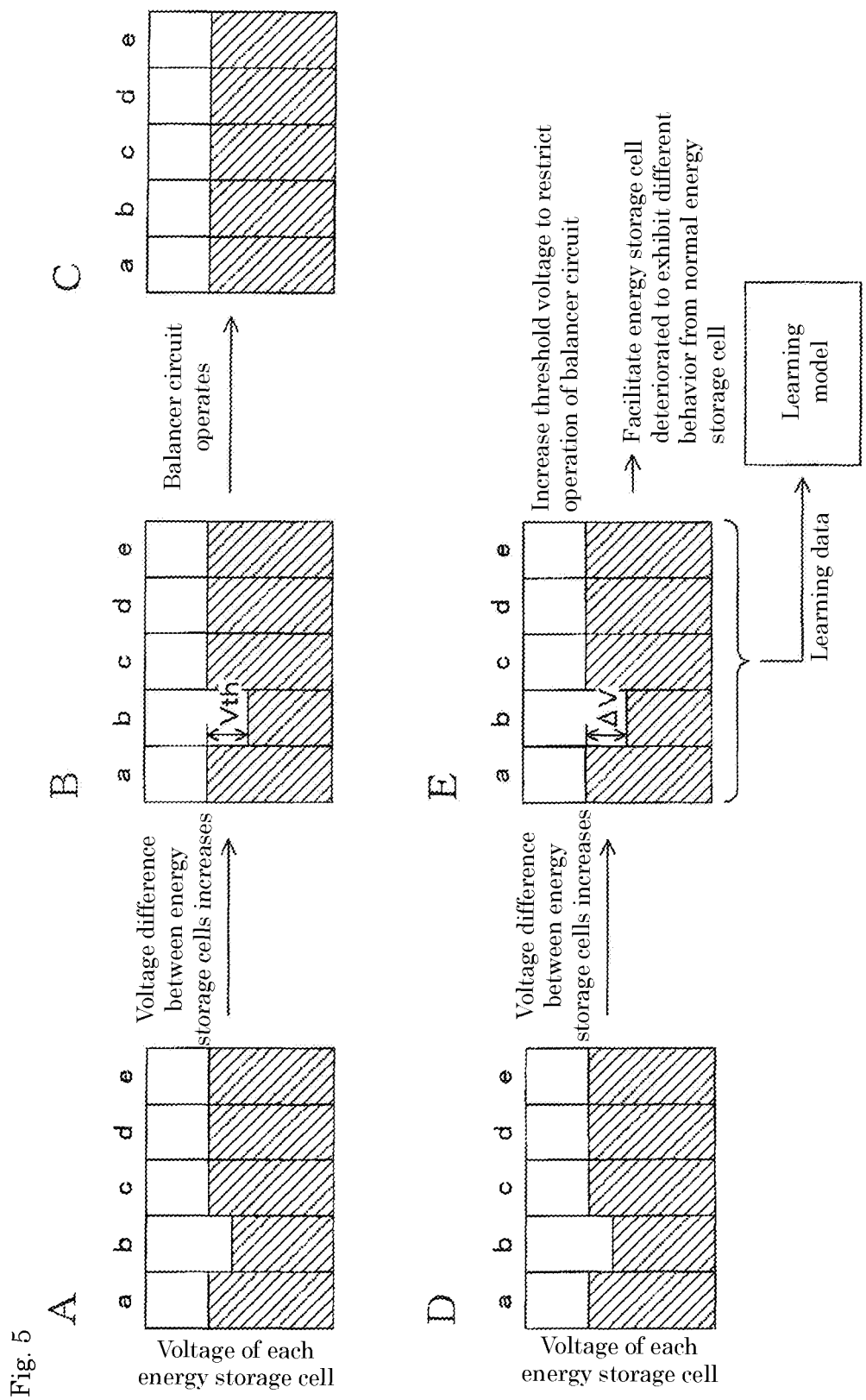
FIG. 5 is a diagram showing an example of a transition in a state of each of energy storage cells in an energy storage module.

FIG. 5 is a diagram showing an example of a transition in the state of each of the energy storage cells in each of the energy storage modules. Here, the energy storage cells are respectively denoted with reference signs a, b, c, d, and e. In FIG. 5, the voltage (state of charge) of each of the energy storage cells is indicated by hatch lines. The voltage difference between the energy storage cells is exaggerated in FIG. 5, and the actual voltage difference is smaller (e.g., several tens of mV approximately). Each of states A to C in an upper stage shows the transition in the state of each of the energy storage cells when the balancer circuit 71 is in the normal operational state. In the state A, the voltages of the energy storage cells a, c, d, and e are approximately identical, but the voltage of the energy storage cell b is smaller than the voltages of the other energy storage cells. In this case, the energy storage cell b has deteriorated or shows a potential sign of abnormality compared with the other energy storage cells.

On an assumption that the energy storage cells in the state A are continuously used, and in the state B, the voltage difference between the energy storage cells (i.e., a difference in voltage between the energy storage cell b and the other energy storage cells in FIG. 5) exceeds a threshold voltage Vth. Then, the operation of the balancer circuit 71 starts, causing the energy storage cells other than the energy storage cell b to discharge. As a result, the voltages of these energy storage cells are balanced.

Subsequently for example, when each of the energy storage cells is charged, the voltages of the energy storage cells increase in a balanced state and reach the state C.

Next, the operation of the battery management unit 50 to control the balancer circuit 71 in this embodiment will be described. The battery management unit 50 is capable of changing the threshold voltage that causes the balancer circuit 71 to start the operation (balancing), from the threshold voltage Vth in the normal state to a threshold voltage Vth2 of larger value. Each of states D and E in a lower stage shows the transition in the state of each of the energy storage cells when the operation of the balancer circuit 71 is changed from the normal state. The state D is the same as the state A.

On an assumption that the energy storage cells in the state D are continuously used, and in the state E, a voltage difference ΔV between the energy storage cells (i.e., the difference in voltage between the energy storage cell b and the other energy storage cells in FIG. 5) exceeds the threshold voltage Vth (the voltage difference ΔV is smaller than the threshold voltage Vth2). In this state, the balancer circuit 71 does not start balancing as in the normal operational state. For example, in the state E, the battery management unit 50 collects data such as the voltage, the current, the temperature, and the SOC of each of the energy storage cells (energy storage modules), and provides the data to the server device 2 via the communication device 1, as learning data for the learning model 23. Here, the second communication unit 53 transmits the data collected, i.e., various data indicating the state of the energy storage cells (energy storage modules), to the server device 2.

Accordingly, it is possible to acquire data reflecting an actual state of each of the energy storage cell that has deteriorated and the energy storage cell that is turning into the abnormal state.

Next, a relationship between each of the modes of the learning model 23 and the operation of the battery management unit 50 to control the balancer circuit 71 will be described.

FIG. 6 is a diagram showing an example of the operation of the battery management unit 50 to control the balancer circuit 71. Here, cases 1, 2, 3, 4, and 5 will be described.

The case 1 shows a case where the learning model 23 shifts to the learning mode. The control unit 51 changes the threshold voltage (that causes the balancer circuit 71 to balance the voltages) to a larger value. The control unit 51 acquires the data including the voltage and the temperature of each of the energy storage cells, and provides the data to the learning model 23. Accordingly, it is easier to identify the energy storage cell that has deteriorated or the energy storage cell that is turning into the abnormal state, each exhibiting any different behavior from an energy storage cell in a normal state.

The case 2 shows the case where the learning model 23 shifts to the learning mode. The control unit 51 changes the operation of the balancer circuit 71 to a stopped state. The control unit 51 acquires the data including the voltage and the temperature of each of the energy storage cells, and provides the data to the learning model 23. Accordingly it is easier to identify the energy storage cell that has deteriorated or the energy storage cell that is turning into the abnormal state, each exhibiting any different behavior from an energy storage cell in a normal state.

The case 3 shows the case where the learning model 23 shifts to the learning mode. The control unit 51 causes one of the plurality of energy storage cells to discharge in order to increase the voltage difference between the plurality of energy storage cells. For example, the control unit 51 causes one of the plurality of energy storage cells exhibiting the minimum voltage to discharge. As a result, the voltage and the SOC of the energy storage cell exhibiting the minimum voltage are decreased, thereby increasing the voltage difference between the plurality of energy storage cells (e.g., the difference between the maximum voltage and the minimum voltage). The control unit 51 acquires the data including the voltage and the temperature of each of the energy storage cells, and provides the data to the learning model 23. Accordingly, it is possible to simulate the energy storage cell that has deteriorated or the energy storage cell that is turning into the abnormal state.

The case 4 shows a case where the learning model 23 shifts to the detection mode. The control unit 51 causes the balancer circuit 71 to operate in the normal operational state (predetermined state). In other words, in the detection mode where the learning model 23 (that has learned) actually detects the state of each of the energy storage cells, the control unit 51 may cause the balancer circuit 71 to operate in the normal operational state. The control unit 51 acquires the data including the voltage and the temperature of each of the energy storage cells, and provides the data to the learning model 23.

With this configuration, it is possible to accurately grasp a degree of deterioration or abnormality of an energy storage cell (energy storage module) that is provided in a mobile object or a facility based on data acquired in actual usage conditions of the energy storage cell (energy storage module). The learning model 23 has learned the data regarding the energy storage cell that has deteriorated or the energy storage cell that is turning into the abnormal state, each exhibiting any different behavior from the energy storage cells in the normal state. Thus, the learning model 23 instantly detects the deteriorated state or the abnormal state of each of the energy storage cells.

The case 5 shows the case where the learning model 23 shifts to the detection mode. The control unit 51 causes the balancer circuit 71 to be in any one of the states in the cases 1, 2, and 3 previously described. In other words, in the detection mode where the learning model 23 (that has learned) actually detects the state of each of the energy storage cells, the control unit 51 changes the state of the balancer circuit 71 from the normal operational state. The control unit 51 acquires the data including the voltage and the temperature of each of the energy storage cells, and provides the data to the learning model 23.

Accordingly it is possible to verify whether or not the learning model 23 is valid. When the learning model 23 (that has learned) instantly detects an energy storage module where the balancer circuit 71 is changed from the normal operational state, or detects a specific energy storage cell included in the energy storage module, the learning model 23 may be determined as highly valid. With the learning model 23 that has learned, it is possible not only to detect any one of the energy storage cells that has deteriorated; but it is also possible to detect the energy storage module including the balancer circuit 71 that is not in the normal operational state or the cell monitoring unit 70 that is not in a normal operational state, and to detect a bank including the battery management unit 50 that is not in a normal operational state.

FIG. 7 is a block diagram showing another example of the configuration of the battery management unit 50. As shown in FIG. 7, the battery management unit 50 may include a learning model 54. The learning model 54 may be provided with the same configuration and function as the learning model 23 previously described. The battery management unit 50 may be provided with the same function as the server device 2, and thus identifies which mode (the learning mode or the detection mode) the learning model 54 is in. With this configuration, the battery management unit 50 monitors each of the energy storage modules (energy storage cells) and instantly detects the deteriorated state or the abnormal state of the corresponding energy storage module (energy storage cell).

Figure 8:
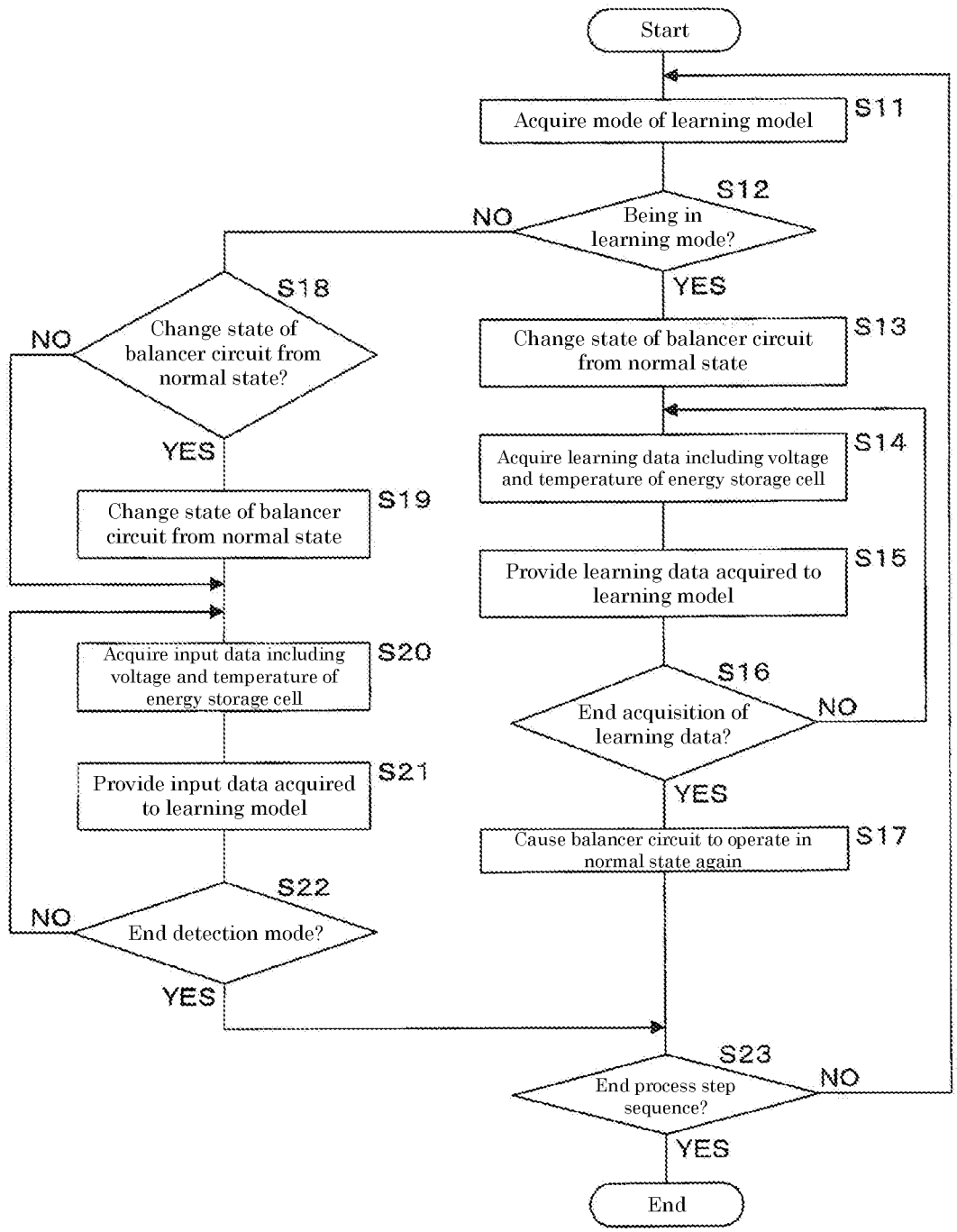
FIG. 8 is a flowchart showing an example of a process step sequence performed by the battery management unit.

FIG. 8 is a flowchart showing an example of a process step sequence performed by the battery management unit 50. For convenience of description, the process step sequence will be described on an assumption that the control unit 51 is the subject of the process step sequence. The control unit 51 acquires the mode of the learning model (S11), and determines whether or not the learning model is in the learning mode (S12). In a case where the learning model is in the learning mode (S12: YES), the control unit 51 changes the state of the balancer circuit from the normal state (S13). The change from the normal state may correspond, for example, to any one of the cases 1, 2, and 3 in FIG. 6.

The control unit 51 acquires the learning data including the voltage and the temperature of each of the energy storage cells (S14). The control unit 51 transmits the learning data acquired to the server device 2 so that the learning model is provided with the learning data acquired (S15). The control unit 51 acquires the learning data by collecting the data detected at a predetermined sampling cycle over a required period of time.

The control unit 51 determines whether or not to stop acquisition of the learning data (S16). On a determination not to stop the acquisition of the learning data (S16: NO), the control unit 51 continues the process steps from step S14. On a determination to stop the acquisition of the learning data (S16: YES), the control unit 51 causes the balancer circuit to be back in the normal state (S17), and proceeds to step S23 as will be described later.

In a case where the learning model is not in the learning mode (S12: NO), in other words, in a case where the learning model is in the detection mode, the control unit 51 determines whether or not to change the state of the balancer circuit from the normal state (S18). The change from the normal state may correspond, for example, to any one of the cases 1, 2, and 3 in FIG. 6. In other words, in the detection mode, the control unit 51 may select any one of the states of the balancer circuit as follows: the normal operational state and the restricted form of the normal operational state.

On a determination to change the state of the balancer circuit from the normal state (S18: YES), the control unit 51 changes the state of the balancer circuit from the normal state (S19) and proceeds to step S20 as will be described later. On a determination not to change the state of the balancer circuit from the normal state (S18: NO), the control unit 51 performs step S20 as will be described later without performing step S19.

The control unit 51 acquires the input data including the voltage and the temperature of each of the energy storage cells (S20). The control unit 51 transmits the input data acquired to the server device 2, so that the learning model is provided with the input data acquired (S21). Note that, the control unit 51 acquires the input data in the detection mode by collecting the data detected at the predetermined sampling cycle over the required period of time.

The control unit 51 determines whether or not to end the detection mode (S22). On a determination not to end the detection mode (S22: NO), the control unit 51 continues the process steps from the step S20. On a determination to end the detection mode (S22: YES), the control unit 51 determines whether or not to end the process step sequence (S23). On a determination not to end the process step sequence (S23: NO), the control unit 51 continues the process steps from step S11. On a determination to end the process step sequence (S23: YES), the control unit 51 ends the process step sequence.

The control unit 51 of this embodiment may be a computer of a general-purpose type, the computer including a CPU (processor), a RAM (memory), and the like. In other words, each process step sequence, such as the process step sequence in FIG. 8, may be predetermined in a computer program, and the computer program may be loaded into the RAM (memory) in the computer. Then, the CPU (processor) executes the computer program on the computer to function as the control unit 51. The computer program may be recorded in a recording medium and distributed. The learning model 23 that has learned in the server device 2 and a computer program based on the learning model 23 may be distributed via the network N and the communication device 1 to the target devices, P, U, D, and M, the battery management unit 50, and a terminal device, each as the remote monitoring target, so as to be installed therein.

In order to cause the computer to cause the learning model regarding the energy storage devices to learn, the computer program causes the computer to execute three steps as follows: acquiring information regarding whether the learning model is in a first mode or in a second mode; changing the operation of the balancer circuit (configured to balance the voltages between the energy storage devices) from the predetermined state in the case where the learning model is in the first mode; and acquiring input data including at least any one of a voltage, a current, a temperature, and an SOC of each of the energy storage devices to provide the input data to the learning model.

In the case where the learning model is in the first mode, the computer program may cause the computer to further execute a step of acquiring the input data to provide the input data to the learning model, while leaving the operation of the balancer circuit in the predetermined state.

In order to cause the computer to detect a state of each of the energy storage devices, the computer program causes the computer to execute two steps as follows: inputting the input data (including at least any one of the voltage, the current, the temperature, and the SOC of each of the energy storage devices) to the learning model that has learned based on the computer program previously described; and detecting the state of each of the energy storage devices.

As has been described above, with the battery management unit of this embodiment, in the case where the learning model (configured to detect the state of each of the energy storage cells) is caused to learn, it is possible to change the degree, to which the voltage or the SOC of each of the energy storage cells is automatically adjusted, in accordance with the operation of the balancer circuit. Accordingly, it is possible to acquire the data reflecting the actual state of the energy storage cell that has deteriorated or the energy storage cell that is turning into the abnormal state; and it is possible to instantly detect the deteriorated state or the abnormal state of each of the energy storage cells.

In an embodiment, a technical concept may be as follows. A method is a learning method for a learning model. The method includes the steps as follows: changing an operation of a balancer circuit that balances the voltages between energy storage devices from a predetermined state; and acquiring input data including at least any one of a voltage, a current, a temperature, and an SOC of each of the energy storage devices to provide the input data to the learning model. In a single energy storage module or a plurality of energy storage modules, the operation of the balancer circuit may be changed from the predetermined state in various ways, such as increasing or decreasing a threshold voltage that causes the balancer circuit to balance the voltages, or changing the operation of the balancer circuit to a stopped state. Then, the input data is acquired and provided to the learning model. In the single energy storage module or the plurality of energy storage modules, the state of the balancer circuit may not be changed (in other words, the balancer circuit may be left in a normal operational state). Then, the input data is acquired and provided to the learning model. The input data may be provided to a learning model in a server. With these approaches, it is possible to provide, from a limited number of the energy storage modules, the input data in multiple ways to the learning model. In other words, it is possible to efficiently prepare big data for learning.

Second Embodiment

Figure 9:
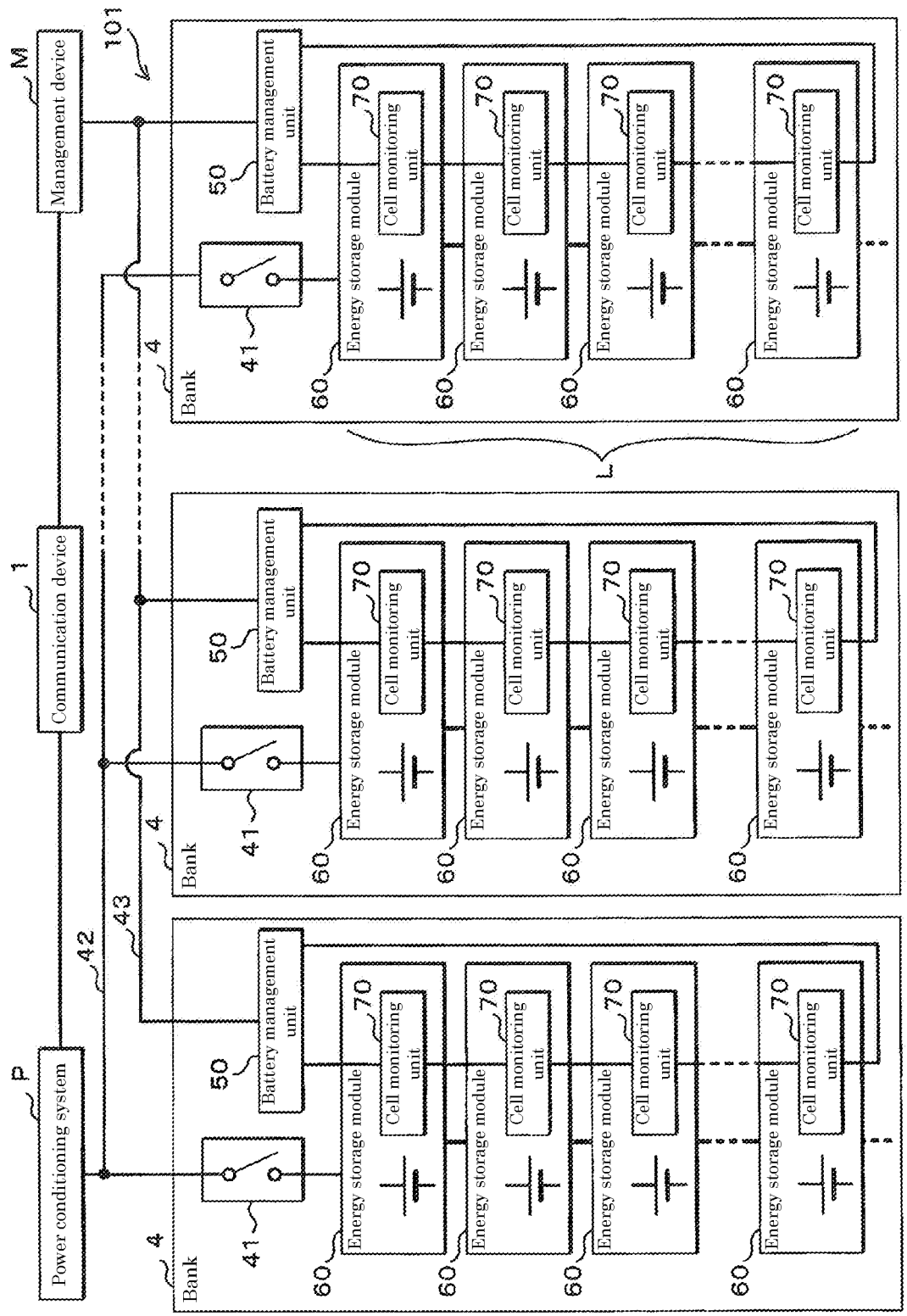
FIG. 9 is a block diagram showing a configuration example of an energy storage system.

FIG. 9 is a block diagram showing a configuration example of an energy storage system 101. The energy storage system 101 has a hierarchical configuration including a plurality of energy storage cells, a plurality of energy storage modules 60, a plurality of banks 4, and a domain. In the hierarchical configuration, the plurality of energy storage cells are connected in series in each of the plurality of energy storage modules 60; the plurality of energy storage modules 60 are connected in series in each of the plurality of banks 4; and the plurality of banks 4 are connected in parallel in the domain. The energy storage system 101 in FIG. 9 includes a single domain.

The energy storage system 101 is connected to a power conditioning system P. Each of the plurality of banks 4 is connected to the power conditioning system P via a power line 42. Each of the banks 4 is charged with electric power supplied via the power conditioning system P. Then, each of the banks 4 discharges the electric power that is to be outputted externally via the power conditioning system P. The power conditioning system P is connected, for example, to a power generating system and/or a power transmission system.

Each of the banks 4 includes a switch 41. The switch 41 connects and disconnects each of the plurality of energy storage modules 60 (that are connected in series) to and from the power line 42. When the switch 41 is closed, each of the plurality of energy storage modules 60 is connected to the power line 42. When the switch 41 is open, each of the plurality of energy storage modules 60 is disconnected from the power line 42. When each of the plurality of energy storage modules 60 is connected to the power line 42, the corresponding energy storage module 60 is charged or discharges (i.e., is energized) via the power conditioning system P, the power line 42, and the switch 41.

Each of the banks 4 includes the plurality of energy storage modules 60 and a battery management unit (BMU) 50. Each of the energy storage modules 60 includes a cell monitoring unit (CMU) 70. The cell monitoring unit 70 in each of the energy storage modules 60 is connected to the battery management unit 50. The battery management unit 50 communicates with each of the cell monitoring units 70. The battery management unit 50 is supplied with electric power via a power path (not shown) other than the power line 42, and thus operates regardless of a state of the switch 41.

The energy storage system 101 includes a management device M. The management device M is a BMU that manages each of energy storage devices in the domain. The battery management unit 50 in each of the banks 4 is connected to the management device M via a communication line 43. A communication device 1 is connected to the management device M and/or the power conditioning system P. The communication device 1 may include a communication device connected to the management device M and a communication device connected to the power conditioning system P. The battery management unit 50 transmit/receives information to/from the management device M. The management device M integrates the information from a plurality of the battery management units 50 and outputs the information to the communication device 1.

Figure 10:
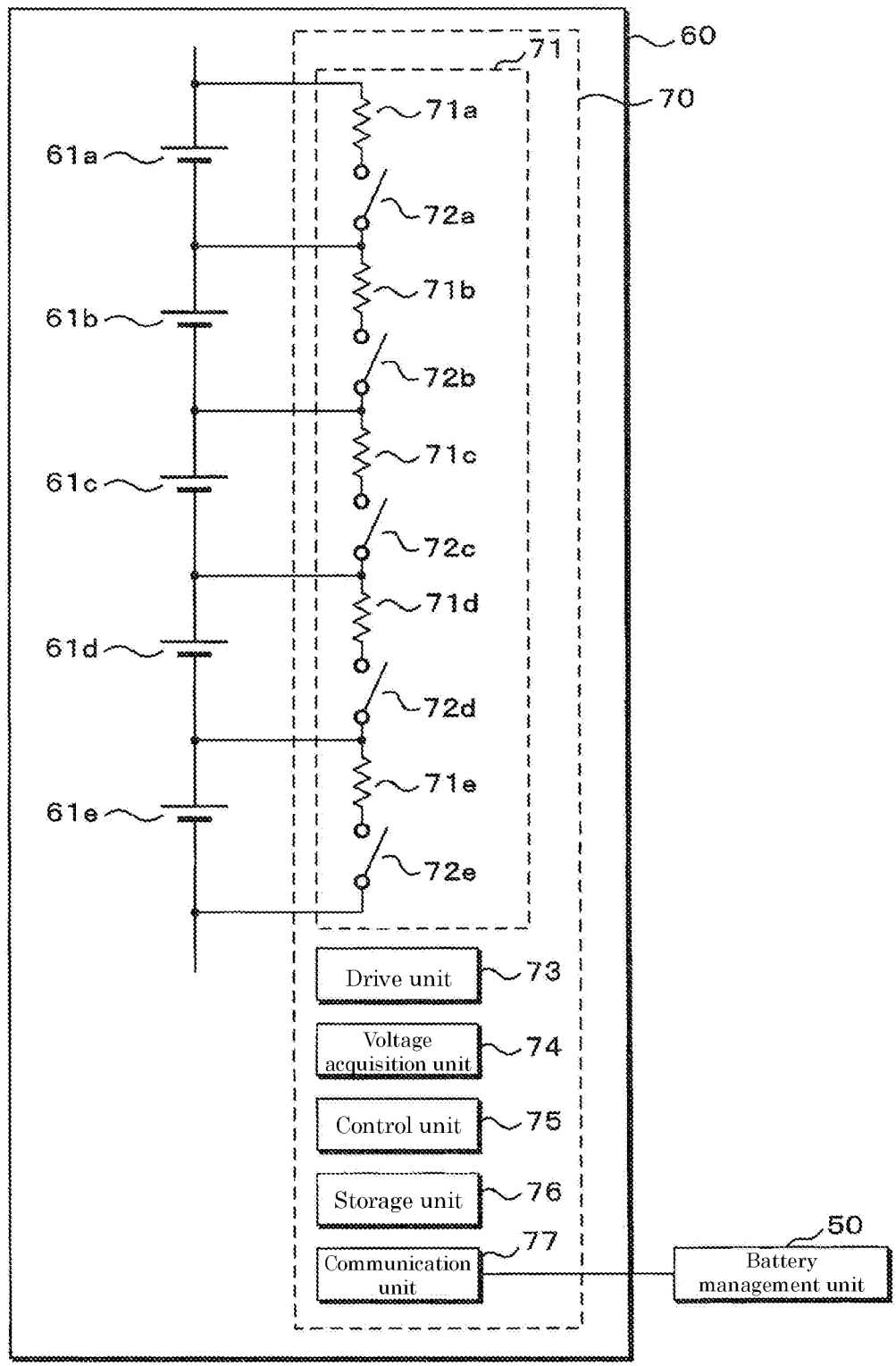
FIG. 10 is a block diagram showing a configuration example of the energy storage module.

FIG. 10 is a block diagram showing a configuration example of each of the energy storage modules 60. In each of the energy storage modules 60, the cell monitoring unit 70 includes a balancer circuit 71, a drive unit 73, a voltage acquisition unit 74, a control unit 75, a storage unit 76, and a communication unit 77. In each of the energy storage modules 60, a plurality of energy storage cells 61a, 61b, 61c, 61d, and 61e are connected in series. In FIG. 10, the number of the energy storage cells connected in series is five only for convenience of description. Thus, the number of the energy storage cells included in the energy storage module 60 is not limited to five. Further, each of the energy storage modules 60 may include an energy storage cell that is connected in parallel to the other energy storage cells. The plurality of energy storage cells 61a to 61e are electrically connected in series to energy storage cells that are included in the others of the plurality of energy storage modules 60. Concurrently the plurality of energy storage cells 61a to 61e are electrically connected to the switch 41.

The balancer circuit 71 includes a series circuit of a resistor 71a and a switch 72a, a series circuit of a resistor 71b and a switch 72b, a series circuit of a resistor 71c and a switch 72c, a series circuit of a resistor 71d and a switch 72d, and a series circuit of a resistor 71e and a switch 72e. The series circuit of the resistor 71a and the switch 72a is connected in parallel to the energy storage cell 61a; the series circuit of the resistor 71b and the switch 72b is connected in parallel to the energy storage cell 61b; the series circuit of the resistor 71c and the switch 72c is connected in parallel to the energy storage cell 61c; the series circuit of the resistor 71d and the switch 72d is connected in parallel to the energy storage cell 61d; and the series circuit of the resistor 71e and the switch 72e is connected in parallel to the energy storage cell 61e. Each of the switches 72a to 72e may be a switching element such as a field effect transistor (FET), or a switching circuit such as a relay.

The drive unit 73 drives each of the switches 72a to 72e to be on or off. When each of the switches 72a to 72e is the FET, the drive unit 73 outputs a gate signal to a gate of the FET to turn the FET on and off. The voltage acquisition unit 74 acquires a voltage of each of the energy storage cells 61a to 61e. The storage unit 76 stores a threshold voltage predetermined.

The control unit 75 identifies a maximum voltage and a minimum voltage among the respective voltages of the energy storage cells 61a to 61e that the voltage acquisition unit 74 has acquired. When a voltage difference between the maximum voltage and the minimum voltage is equal to or more than the threshold voltage, the control unit 75 turns on a switch connected in parallel to the energy storage cell having the maximum voltage, so as to cause the energy storage cell (having the maximum voltage) to discharge via the resistor. As a result, the voltage of the energy storage cell (having the maximum voltage) is decreased. With this configuration, the voltages are balanced between the energy storage cells 61*a* to 61*e*.

When each of the energy storage cells 61*a* to 61*e* has a lower SOC than the others of the energy storage cells 61*a* to 61*e*, the corresponding energy storage cell 61*a*, 61*b*, 61*c*, 61*d*, or 61*e* exhibits a lower voltage than the others of the energy storage cells 61*a* to 61*e*. In this state, the balancer circuit 71 operates to cause the others of the energy storage cells 61*a* to 61*e* to discharge, so that the others of the energy storage cells 61*a* to 61*e* exhibit lower SOC and lower voltages too. With this configuration, the voltages and the states of charge of the plurality of energy storage cells in each of the energy storage modules 60 are balanced. The balancer circuit 71, the drive unit 73, the voltage acquisition unit 74, the control unit 75, and the storage unit 76 correspond to a balancing unit.

The communication unit 77 has a function of proceeding with, for example, a serial communication with the battery management unit 50. The control unit 75 causes the communication unit 77 to transmit, to the battery management unit 50, information indicating the voltage of each of the energy storage cells 61*a* to 61*e* that the voltage acquisition unit 74 has acquired.

Figure 11:
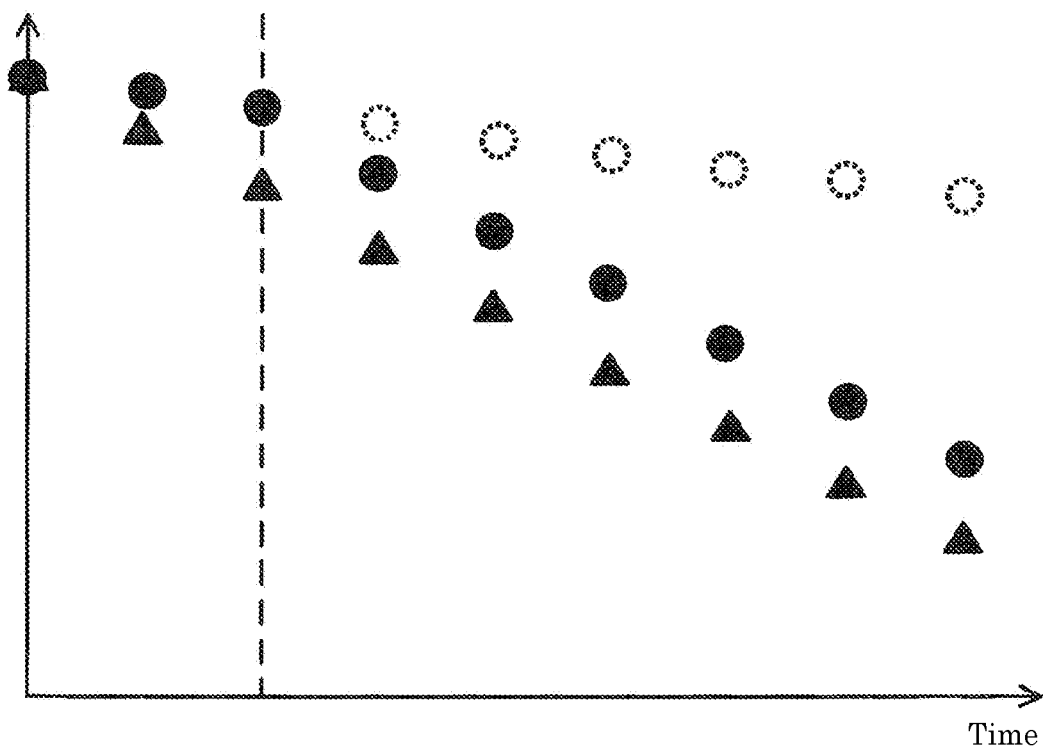
FIG. 11 is a graph schematically showing a temporal change in voltage of each of the energy storage cells when a balancer circuit is in an operational state.

FIG. 11 is a graph schematically showing a temporal change in voltage of each of the energy storage cells when the balancer circuit 71 is in the operational state. In the graph, a horizontal axis represents a period of time during which the energy storage cells are left in a non-energized state; and a vertical axis represents the voltages of the energy storage cells. The voltage may be an open circuit voltage (OCV). Here, a triangle indicates a voltage of an energy storage cell that has deteriorated relatively quickly; and a circle indicates a voltage of an energy storage cell that is in a normal state and exhibits a deterioration rate within a tolerable range. The voltage of the energy storage cell that has deteriorated decreases more quickly, thereby generating a difference from the voltage of the energy storage cell in the normal state. As time elapses, the difference in voltage increases and reaches the threshold voltage. In FIG. 11, a broken line shows a point of time when the difference in voltage between the energy storage cell that has deteriorated and the energy storage cell in the normal state reaches the threshold voltage. In FIG. 11, a circle drawn with a broken line shows the temporal change in voltage of the energy storage cell in the normal state when the balancer circuit 71 is not in the operational state.

As shown in FIG. 11, the voltages of the plurality of energy storage cells are balanced. In this state, the voltage of the energy storage cell in the normal state decreases more than when the balancer circuit 71 is not in the operational state; and thus, the difference in voltage between the energy storage cell that has deteriorated and the energy storage cell in the normal state is smaller than when the balancer circuit 71 is not in the operational state. The difference in voltage between the energy storage cell that has deteriorated and the energy storage cell in the normal state is less prone to increase regardless of time elapsed. Accordingly, when the balancer circuit 71 is in the operational state, it is presumably difficult to detect the energy storage cell that has deteriorated based on the temporal change in voltage. On the other hand, when the balancer circuit 71 is not in the operational state, the difference in voltage between the energy storage cell that has deteriorated and the energy storage cell in the normal state increases as time elapses. In this state, it is presumably easy to detect the energy storage cell that has deteriorated based on the temporal change in voltage.

Figure 12:
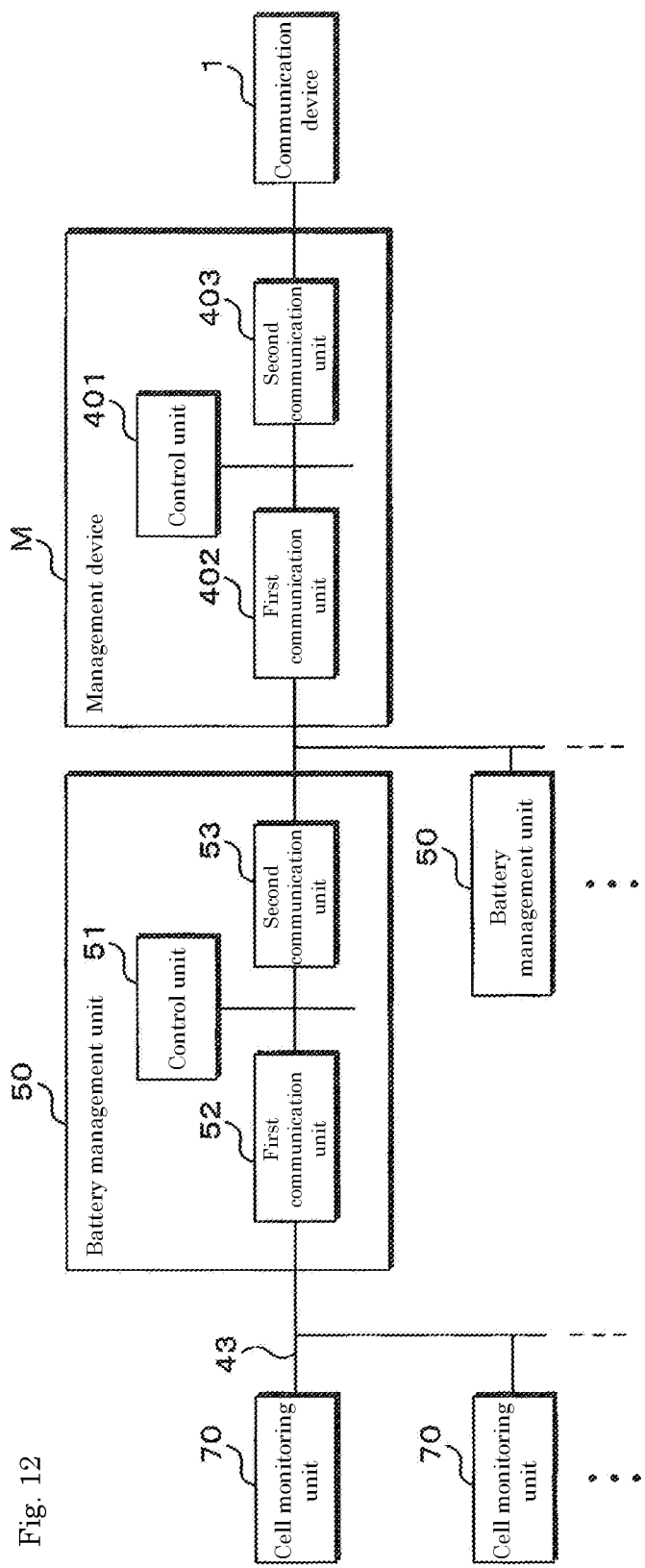
FIG. 12 is a block diagram showing a functional configuration example of the battery management unit and a management device.

FIG. 12 is a block diagram showing a functional configuration example of the battery management unit 50 and the management device M. The battery management unit 50 includes a control unit 51, a first communication unit 52, and a second communication unit 53. The control unit 51 is a CPU processor. The first communication unit 52 is connected to the plurality of cell monitoring units 70 in each of the banks 4. The first communication unit 52 receives information transmitted from each of the cell monitoring units 70. The second communication unit 53 is connected to the management device M via the communication line 43. The control unit 51 causes the second communication unit 53 to transmit the information received from each of the plurality of cell monitoring units 70 to the management device M.

The management device M employs a computer. The management device M includes a control unit 401, a first communication unit 402, and a second communication unit 403. The control unit 401 is a CPU processor. The first communication unit 402 is connected to the plurality of the battery management units 50. The first communication unit 402 receives information transmitted from each of the battery management units 50. The second communication unit 403 is connected to the communication device 1. The control unit 401 causes the second communication unit 403 to transmit the information received from each of the plurality of battery management units 50 to the communication device 1. The communication device 1 transmits the information received from the management device M to a server device 2. In other words the management device M transmits the information to the server device 2 via the communication device 1; and each of the battery management units 50 transmits the information to the server device 2 via the management device M and the communication device 1.

Next, a deterioration determination method according to this embodiment will be described. The server device 2 functions as a deterioration determination device. In order to determine whether or not any one of the energy storage cells has deteriorated based on the temporal change in voltage of each of the energy storage cells, a learning model 23 undergoes machine learning. The machine learning is executed, for example, in the server device 2.

When the plurality of energy storage cells are connected in series and are in a substantially identical state of charge, the voltage of each of the plurality of energy storage cells is acquired. In each of the banks 4, when the switch 41 is open and the balancer circuit 71 is not in the operational state, the voltage of each of the energy storage cells is acquired by the voltage acquisition unit 74. Then, the voltage acquired is transmitted to the server device 2 via each of the battery management units 50, the management device M and the communication device 1. The battery management unit 50 in each of the banks 4 is connected to the management device M via a communication line 43. The temporal change in voltage of each of the plurality of energy storage cells is stored, for example, in a storage unit 21 of the server device 2.

Figure 13:
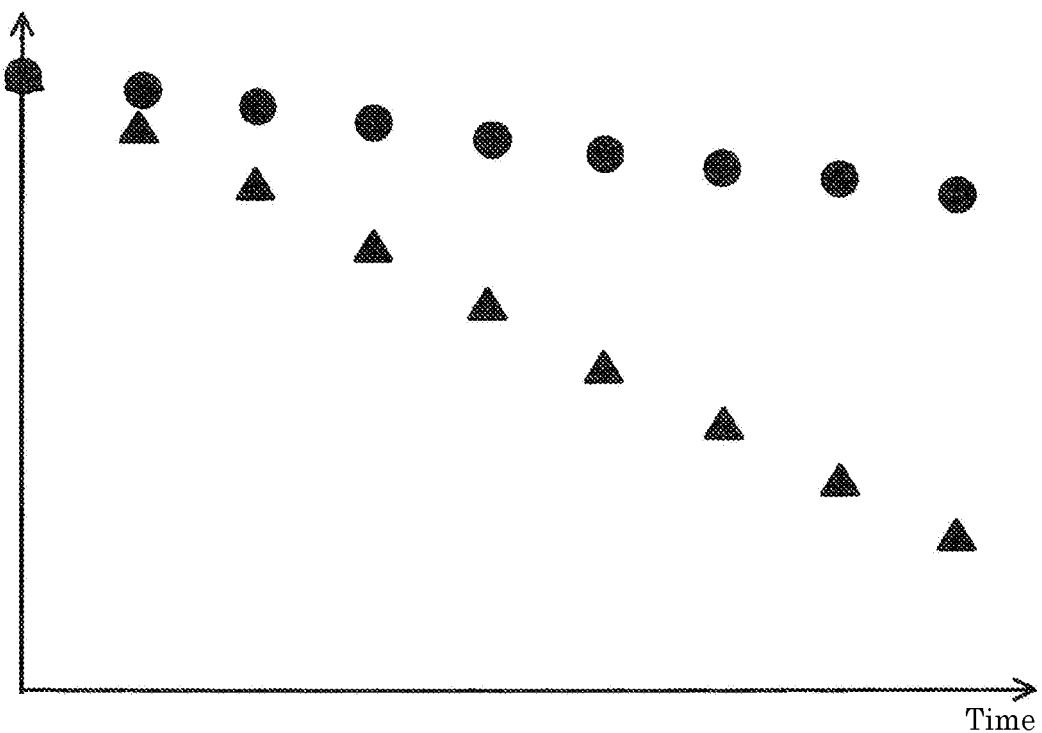
FIG. 13 is a graph schematically showing the temporal change in voltage of each of the energy storage cells when the voltages are not balanced between the energy storage cells.

FIG. 13 is a graph schematically showing the temporal change in voltage of each of the energy storage cells when the voltages are not balanced between the energy storage cells. In the graph, a horizontal axis represents a period of time during which the energy storage cells are left in a non-energized state; and a vertical axis represents the voltages of the energy storage cells. The voltage may be the OCV. Here, a triangle indicates the voltage of the energy storage cell that has deteriorated, and a circle indicates the voltage of the energy storage cell that is in the normal state and exhibits the deterioration rate within the tolerable range. The energy storage cell that has deteriorated deteriorates more quickly than the energy storage cell in the normal state. The voltage of the energy storage cell that has deteriorated decreases more quickly, thereby generating a difference from the voltage of the energy storage cell in the normal state. Here, the difference in voltage between the energy storage cell in the normal state and the energy storage cell that has deteriorated continues to increase as time elapses, unlike in FIG. 11 that shows the temporal change in voltage of each of these two when the voltages are balanced.

When a certain period of time has elapsed, the difference in voltage between the energy storage cell in the normal state and the energy storage cell that has deteriorated is significant. Accordingly, it is possible to determine whether or not each of the energy storage cells has deteriorated based on the voltage of the corresponding energy storage cell. For example, when the energy storage cells have been in the non-energized state for a predetermined period of time, and when any one of the energy storage cells exhibits a voltage less than a threshold value, the corresponding energy storage cell may be determined as deteriorated. Alternatively, when the energy storage cells have been in the non-energized state for the predetermined period of time, and when any one of the energy storage cells exhibits a ratio of the voltage to an initial voltage being less than the threshold value, the corresponding energy storage cell may be determined as deteriorated. Still alternatively the temporal change in voltage may be approximated to the linear function, and when any one of the energy storage cells shows an absolute value of a ratio of the temporal change in voltage exceeding a threshold value, the corresponding energy storage cell may be determined as deteriorated. Further alternatively when the plurality of energy storage cells have been in the non-energized state for the predetermined period of time, and when a predetermined number of the plurality of energy storage cells exhibit(s) a further lower value of voltage, the corresponding energy storage cell(s) may be determined as deteriorated.

Based on the temporal change in voltage of each of the plurality of energy storage cells that has been acquired, a human may determine whether or not the corresponding energy storage cell has deteriorated, or a computer may determine whether or not the corresponding energy storage cell has deteriorated. For example, in the server device 2, a control unit 20 follows a server program 2P; and based on the temporal change in voltage of each of the energy storage cells stored in the storage unit 21, the control unit 20 determines whether or not the corresponding energy storage cell has deteriorated. Based on the determination, each of the energy storage cells is specified as deteriorated or not.

Teaching data is created with regard to each of the plurality of energy storage cells. In the teaching data, the temporal change in voltage of each of the energy storage cells is correlated with a result of identifying whether or not the corresponding energy storage device has deteriorated. The teaching data is stored, for example, in the storage unit 21 of the server device 2. Based on the teaching data created, the learning model 23 undergoes the machine learning. For example, in the server device 2, the control unit 20 follows the server program 2P to cause the learning model 23 to undergo the machine learning. In the machine learning, the learning model 23 learns to adjust a parameter. As a result, even when it is unknown whether or not each of the energy storage cells has deteriorated, based on the temporal change in voltage of each of the energy storage cells, it is possible to determine whether or not the corresponding energy storage cell has deteriorated.

The server device 2 executes the machine learning processing to obtain the learning model 23 that has learned. The machine learning may be executed on a computer other than the server device 2. In this case, learning data as the learning model 23 (that has learned based on the machine learning) is created, and the learning data that has been created is inputted to the server device 2. Then, the server device 2 stores the learning data in the storage unit 21 to obtain the learning model 23 that has learned.

Figure 14:
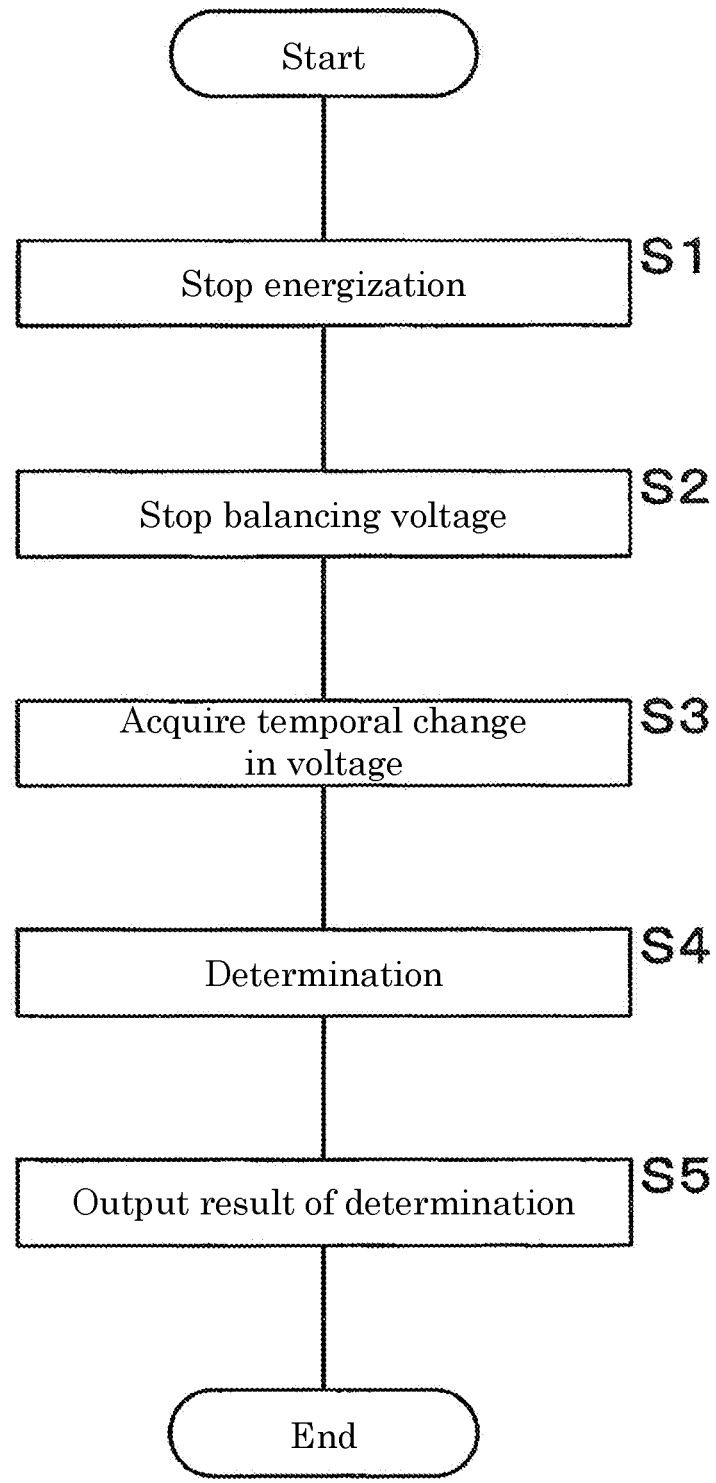
FIG. 14 is a flowchart showing a process step sequence to determine whether or not any one of energy storage devices has deteriorated.

FIG. 14 is a flowchart showing a process step sequence to determine whether or not any one of the energy storage devices has deteriorated. In the server device 2 as the deterioration determination device, the control unit 20 executes process steps below based on the server program 2P. The control unit 20 is configured to determine whether or not each of the energy storage devices has deteriorated. Here, each of the energy storage devices corresponds to each of the energy storage cells included in the energy storage system 101. The control unit 20 disconnects the energy storage module 60 (that includes the energy storage cells to be determined) from the power line 42 (that is used to energize the energy storage module 60). Then, the energy storage module 60 is in the non-energized state (S1). For example, the control unit 20 causes a communication unit 22 to transmit a control signal to the switch 41, which is in the energy storage module 60 including the energy storage cells to be determined, to be open. The control signal is transmitted to the switch 41 via a communication network N, the communication device 1, and the management device M. When the switch 41 is open, the plurality of energy storage modules 60 are disconnected from the power line 42, and each of the plurality of energy storage modules 60 is left in the non-energized state. In this state, the bank 4, in which the switch 41 is open, is disconnected from the power line 42 (main circuit). In process step S1, the control signal may be transmitted to the battery management unit 50 such that the battery management unit 50 follows the control signal to open the switch 41. Instead of transmitting the control signal from the server device 2, the switch 41 may be opened independently in the energy storage system 101. For example, the switch 41 may be opened manually. Processing in the process step S1 corresponds to an energization stop unit.

Next, the control unit 20 stops the balancing of the voltages between the plurality of energy storage cells in each of the energy storage modules 60 that is in the non-energized state (S2). For example, the control unit 20 causes the communication unit 22 to transmit a control signal to the cell monitoring unit 70 to stop the operation of the balancer circuit 71, via the communication network N, the communication device 1, the management device M, and the battery management unit 50. Then, in the cell monitoring unit 70, the control unit 75 stops the operation of the balancer circuit 71, so that the voltages of the plurality of energy storage cells in each of the energy storage modules 60 are not balanced. For example, the operation of the balancer circuit 71 stops in each of the energy storage modules 60 in the bank 4 where the corresponding switch 41 is open. Processing in process step S2 corresponds to the balancing stop unit. Alternatively the process step S2 may be performed simultaneously with the process step S1 or may be performed before the process step S1.

Next, the control unit 20 acquires the temporal change in voltage of each of the energy storage cells in each of the energy storage modules 60 that is in the non-energized state. In this state, the balancer circuit 71 in the corresponding energy storage module 60 is not in the operational state (S3). For example, the control unit 20 causes the communication unit 22 to transmit a control signal to the cell monitoring unit 70 in the energy storage module 60 that includes the energy storage cells to be determined. The control signal is configured to acquire the voltage of each of the energy storage cells to be determined. The control signal is transmitted to the cell monitoring unit 70 via the communication network N, the communication device 1, the management device M, and the battery management unit 50. First, in the cell monitoring unit 70, the voltage of each of the plurality of energy storage cells 61a to 61e in the corresponding energy storage module 60 is acquired when the energy storage cells 61a to 61e are in the substantially identical state of charge. Next, the voltage acquisition unit 74 repeatedly acquires the voltage of each of the energy storage cells 61a to 61e. The voltage that the voltage acquisition unit 74 acquires may be the OCV. The control unit 75 causes the communication unit 77 to sequentially transmit the information indicating the voltage of each of the energy storage cells 61a to 61e that the voltage acquisition unit 74 has acquired. The information indicating the voltage of each of the energy storage cells is sequentially transmitted to the server device 2 via the battery management unit 50, the management device M, the communication device 1, and the communication network N. In the server device 2, the communication unit 22 receives the information indicating the voltage of each of the energy storage cells. The control unit 20 stores the information that the communication unit 22 has received into the storage unit 21. As time elapses, the information indicating the voltage of each of the energy storage cells is sequentially received and stored. Alternatively, the information indicating the voltage of each of the energy storage cells over the time elapsed may be collectively transmitted and collectively received. With this configuration, the temporal change in voltage of each of the energy storage cells is acquired. For example, the temporal change in voltage of each individual of the energy storage cells in the bank 4 (where the switch 41 is open) is acquired. Processing in process step S3 corresponds to an acquisition unit.

Next, the control unit 20 reads the information indicating the temporal change in voltage of each of the energy storage cells from the storage unit 21 and provides the information to the learning model 23. Based on the temporal change in voltage of each of the energy storage cells, the learning model 23 determines whether or not the corresponding energy storage cell has deteriorated (S4). The learning model 23 has learned the difference in temporal change in voltage between the energy storage cell in the normal state and the energy storage cell that has deteriorated. Accordingly based on the temporal change in voltage of each of the energy storage cells, it is possible to determine whether or not the corresponding energy storage cell has deteriorated. Based on the temporal change in voltage of each of the energy storage cells over a different period of time, the learning model 23 may determine whether or not the corresponding energy storage cell has deteriorated; and the different period of time is shorter than the period of time during which the temporal change in voltage of each of the energy storage cells was acquired to create the teaching data. Processing in process step S4 corresponds to a determination unit.

Next, the control unit 20 outputs a result of the determination whether or not each of the energy storage cells has deteriorated (S5). For example, the control unit 20 causes the communication unit 22 to transmit information indicating the result of the determination to a client device 3 via the communication network N. In the client device 3, a communication unit 32 receives the information indicating the result of the determination, and a control unit 30 causes a display unit 33 to display the result of the determination result based on the information that the communication unit 32 has received. The display unit 33 displays, for example, identification information provided to each of the energy storage cells, along with the information regarding whether or not the corresponding energy storage cell (that has been identified based on the identification information) has deteriorated. This configuration causes an administrator of the energy storage system to confirm the result of the determination outputted and to thus know which of the energy storage cells has deteriorated. The process step sequence determines whether or not any one of the energy storage cells (any one of the energy storage devices) has deteriorated, and ends here.

When the process steps sequence (to determine whether or not any one of the energy storage cells has deteriorated) has ended, the energy storage module 60, which includes the energy storage cell(s) determined as deteriorated, is removed from the bank 4. The energy storage module 60 that has been removed may be, for example, replaced with an energy storage module 60 that is newly prepared. In the bank 4 from which the energy storage module 60 has been removed, the plurality of energy storage modules 60 (excluding the energy storage module that has been removed) may be connected to each other. When the determination has been made, the switch 41 is closed in the bank 4 that has been determined, and each of the energy storage modules 60 causes the balancer circuit 71 therein to be back in the operational state. Then, the bank 4 that has been determined is prepared to resume the operation.

Alternatively, in the energy storage system 101, the determination may be made whether or not any one of the energy storage cells has deteriorated in one of the plurality of banks 4. Then, when the determination has been made in the one of the banks 4, the determination may be made whether or not any one of the energy storage cells has deteriorated in the others of the plurality of banks 4 in the energy storage system 101. The determination may be made in one of the banks 4 at a time or more than two of the banks 4 at a time. With this configuration, the determination whether or not any one of the energy storage cells has deteriorated is sequentially made in each of the banks 4. Accordingly, it is possible to carry out protective maintenance on the energy storage system 101 without stopping the overall operation of the energy storage system 101, in other words, while continuing the operation of the energy storage system 101.

As has been described in detail above, in this embodiment, when each of the energy storage modules 60 is in the non-energized state and the voltages of the plurality of energy storage cells are thus not balanced, the temporal change in voltage of each of the energy storage cells is acquired. Then, based on the temporal change in voltage of each of the energy storage cells, the corresponding energy storage cell is determined as deteriorated or not. Each of the operations to stop energizing each of the energy storage modules 60 and to stop balancing the voltages between the energy storage cells is remotely carried out (carried out via the communication network). When the voltages of the plurality of energy storage cells are not balanced, the difference in temporal change in voltage increases between the energy storage cell in the normal state and the energy storage cell that has deteriorated. Accordingly based on the temporal change in voltage of each of the energy storage cells, it is possible to determine whether or not the corresponding energy storage cell has deteriorated and to detect any one of the energy storage cells that has deteriorated, more smoothly than in the conventional method. Further, each of the energy storage cells is smoothly determined as deteriorated or not, and thus, it is even possible to identify an energy storage cell that has deteriorated to a smaller degree than an energy storage cell that was determined as deteriorated by the conventional method. Accordingly, it is possible to detect any one of the energy storage cells that has deteriorated at an earlier stage than in the conventional method. Any one of the energy storage cells that has deteriorated is detected at the earlier stage, and thus, it is possible to remove the corresponding energy storage cell that has deteriorated before a performance of the energy storage system 101 significantly degrades. Consequently, it is possible to decrease the period of time to stop the operation of each of the banks 4 or the energy storage system 101.

In this embodiment, the learning model 23 using supervised learning is used to determine whether or not each of the energy storage cells has deteriorated. The teaching data includes the temporal change in voltage of each of the energy storage cells, and a result of identifying whether or not the corresponding energy storage cell has deteriorated. By using the teaching data, the learning model 23 is caused to learn, based on the temporal change in voltage of each of the energy storage cells, to determine whether or not the corresponding energy storage cell has deteriorated. By using the learning model 23, based on the temporal change in voltage of each of the energy storage cells over a rather short period of time, it is possible to determine whether or not the corresponding energy storage cell has deteriorated. Accordingly it is possible to decrease the period of time to stop the operation of each of the banks 4 or the energy storage system 101 in determining whether or not each of the energy storage cells has deteriorated.

Third Embodiment

Figure 15:
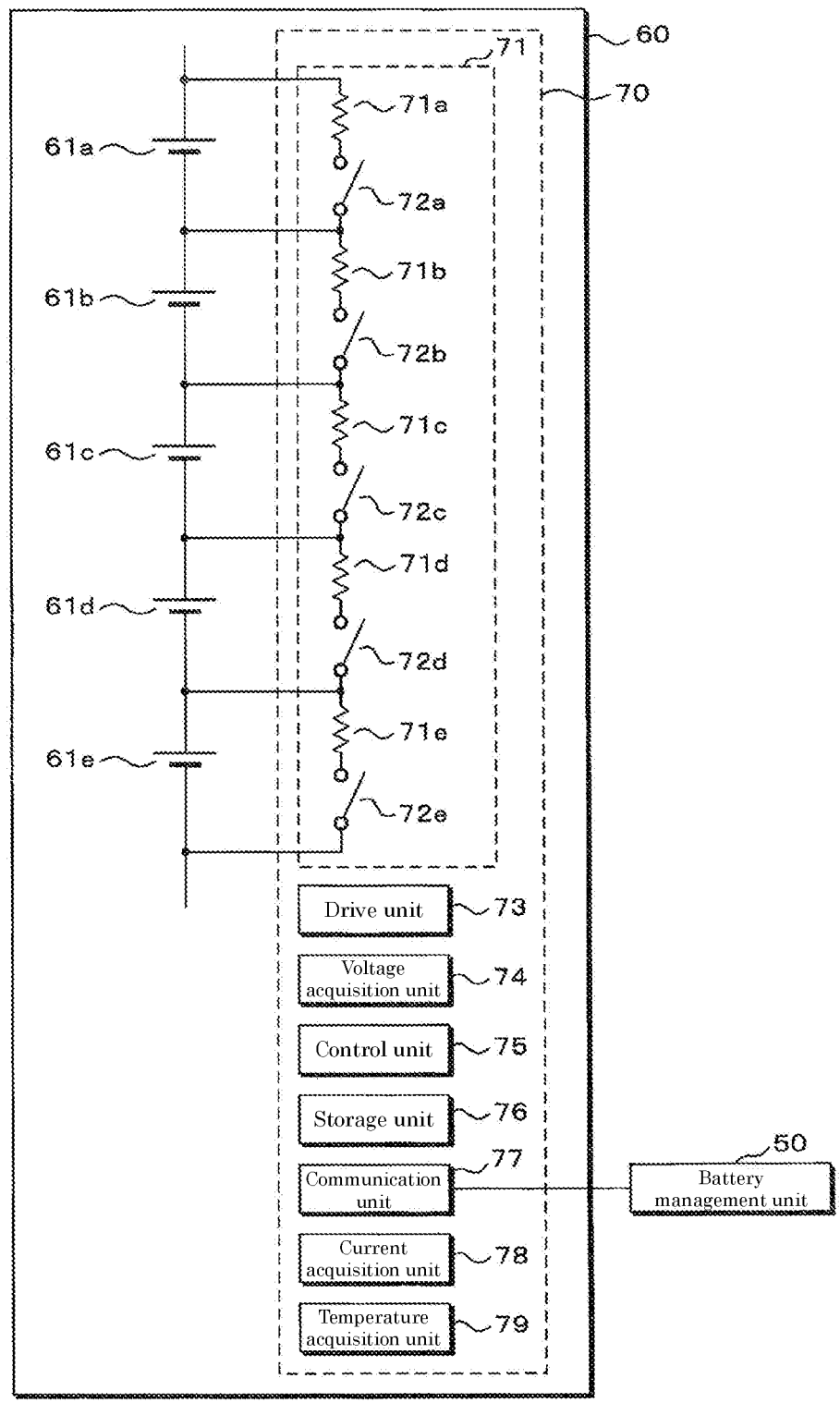
FIG. 15 is a block diagram showing a functional configuration example of the battery management unit and the management device.

In this embodiment, based on a history of an operation of each of the energy storage cells, the corresponding energy storage cell is determined as deteriorated or not. FIG. 15 is a block diagram showing a functional configuration example of a battery management unit 50 and a management device M. A cell monitoring unit 70 further includes a current acquisition unit 78 and a temperature acquisition unit 79. The current acquisition unit 78 sequentially acquires a current flowing through a plurality of the energy storage cells that are connected in series in each of energy storage modules 60. The temperature acquisition unit 79 uses a temperature sensor to sequentially acquire a temperature at a single or a plurality of sections in each of the energy storage modules 60. Similarly a voltage acquisition unit 74 sequentially acquires a voltage of each of the energy storage cells.

When each of the energy storage modules 60 is in operation, a control unit 75 causes a communication unit 77 to sequentially transmit information to the battery management unit 50. The information indicates the voltage that the voltage acquisition unit 74 has acquired, the current that the current acquisition unit 78 has acquired, and the temperature that the temperature acquisition unit 79 has acquired. The information indicating the voltage, the current, and the temperature is transmitted to a server device 2 via the battery management unit 50, the management device M, a communication device 1, and a communication network N. In the server device 2, a communication unit 22 receives the information indicating the voltage, the current, and the temperature. A control unit 20 stores the information indicating the voltage, the current, and the temperature into a storage unit 21. Apart from the configuration described above, each of an energy storage system 101 and a deterioration determination system 100 has the same configuration as described in the first or the second embodiment.

In the server device 2, as time elapses, the information indicating the voltage, the current, and the temperature of the energy storage cells is sequentially received and stored. The information indicating the voltage, the current, and the temperature is stored with regard to each of the energy storage cells. With this configuration, the history of the operation of each of the energy storage cells is acquired.

Teaching data is created with regard to each of the plurality of energy storage cells. In the teaching data, the temporal change in voltage of each of the energy storage cells and the history of the operation of each of the energy storage cells are correlated with a result of identifying whether or not the corresponding energy storage device has deteriorated. Based on the teaching data created, the learning model 23 undergoes the machine learning. Each of the energy storage cells exhibits a different behavior in accordance with the history of the operation of the corresponding energy storage cell. For example, in a case where each of the energy storage cells is repeatedly charged and discharges at high frequency the corresponding energy storage cell deteriorates significantly. As a result, a difference increases between an energy storage cell in a normal state and an energy storage cell that has deteriorated. In the machine learning, the learning model 23 learns to adjust a parameter. As a result, even when it is unknown whether or not each of the energy storage cells has deteriorated, based on the temporal change in voltage of each of the energy storage cells and the history of the operation of each of the energy storage cells, it is possible to determine whether or not the corresponding energy storage cell has deteriorated.

Similarly to the second embodiment, the deterioration determination system 100 according to this embodiment executes process steps to determine whether or not any one of the energy storage cells has deteriorated as shown in the flowchart of FIG. 14. In process step S4, the control unit 20 reads from the storage unit 21 the information indicating the temporal change in voltage of each of the energy storage cells and information indicating the history of the operation of each of the energy storage cells. Then, the control unit 20 provides the information read from the storage unit 21 to the learning model 23. Based on the temporal change in voltage of each of the energy storage cells and the history of the operation of each of the energy storage cells, the learning model 23 determines whether or not the corresponding energy storage cell has deteriorated. The learning model 23 has learned a difference in the temporal change in voltage and a difference in the history of the operation between the energy storage cell in the normal state and the energy storage cell that has deteriorated. Accordingly, based on the temporal change in voltage of each of the energy storage cells and the history of the operation of each of the energy storage cells, it is possible to determine whether or not the corresponding energy storage cell has deteriorated.

As has been described above, in this embodiment, when each of the energy storage modules 60 is in the non-energized state and the voltages of the plurality of energy storage cells are thus not balanced, the temporal change in voltage of each of the energy storage cells is acquired. Based on the temporal change in voltage of each of the energy storage cells and the history of the operation of each of the energy storage cells, the learning model 23 determines whether or not the corresponding energy storage cell has deteriorated. Each of the energy storage cells exhibits the different behavior in accordance with the history of the operation of the corresponding energy storage cell. However, the teaching data includes the temporal change in voltage of each of the energy storage cells, the history of the operation of each of the energy storage cells, and the result of identifying whether or not the corresponding energy storage cell has deteriorated. Accordingly by using the teaching data, the learning model 23 is caused to learn, based on the temporal change in voltage of each of the energy storage cells and the history of the operation of each of the energy storage cells, to determine whether or not the corresponding energy storage cell has deteriorated. By using the learning model 23, based on the temporal change in voltage of each of the energy storage cells and the history of the operation of each of the energy storage cells, it is possible to determine whether or not the corresponding energy storage cell has deteriorated. Regardless of the history of the operation in each of the energy storage cells, it is possible to smoothly determine whether or not the corresponding energy storage cell has deteriorated. Accordingly, even among the plurality of energy storage cells, each having a different history of operation from the others, it is possible to smoothly detect any one of the energy storage cells that has deteriorated. Further, similarly to the first embodiment, it is possible to detect any one of the energy storage cells that has deteriorated at an earlier stage than in the conventional method.

Fourth Embodiment

Figure 16:
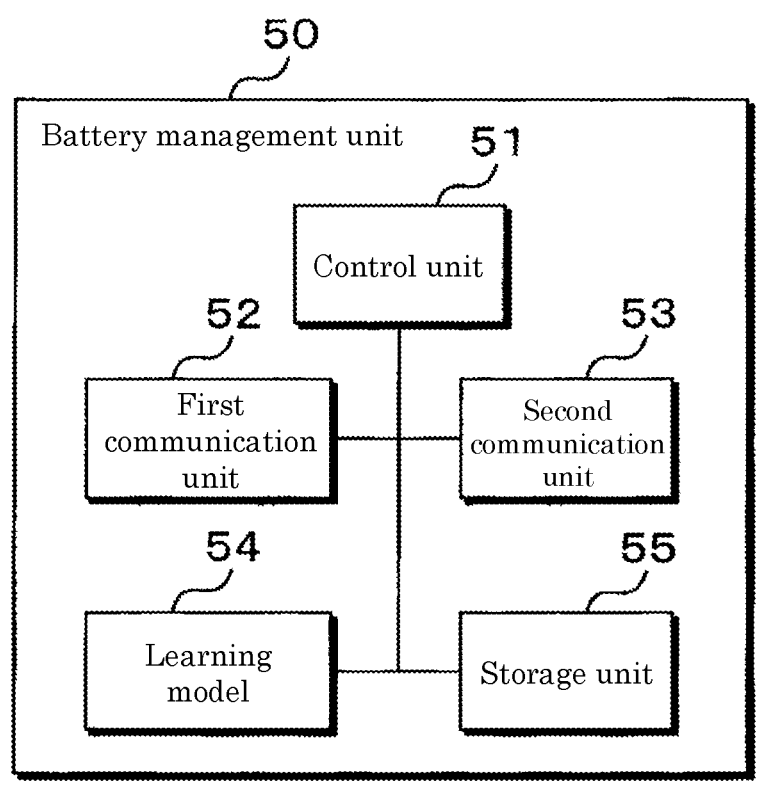
FIG. 16 is a block diagram showing a functional configuration example of the battery management unit.

In this embodiment, a battery management unit 50 functions as a deterioration determination device. FIG. 16 is a block diagram showing a functional configuration example of the battery management unit 50. The battery management unit 50 further includes a learning model 54 and a storage unit 55. The learning model 54 proceeds with the same operation as the learning model 23 described in the first or the second embodiment. The storage unit 55 is a hard disk or a non-volatile memory. In this embodiment, a server device 2 may not include a learning model 23. Apart from the configuration described above, each of an energy storage system 101 and a deterioration determination system 100 has the same configuration as described in the first or the second embodiment.

Similarly to the first or the second embodiment where the learning model 54 undergoes machine learning, the learning model 54 undergoes the machine learning. The machine learning may take place in the battery management unit 50. Alternatively the machine learning may be executed on other computers. In this case, learning data as the learning model 23 (that has learned based on the machine learning) is created, and the learning data created is inputted to the battery management unit 50. Then, the battery management unit 50 stores the learning data created in the storage unit 55 to obtain the learning model 54 that has learned.

Similarly to the second or the third embodiment, the deterioration determination system 100 according to this embodiment executes a process step sequence to determine whether or not any one of energy storage cells has deteriorated as shown in the flowchart of FIG. 14. The battery management unit 50 executes an operation as the deterioration determination device. The battery management unit 50 opens a switch 41 such that each of energy storage modules 60 turns into a non-energized state (S1). Then, the battery management unit 50 causes a cell monitoring unit 70 to stop an operation of a balancer circuit 71, and thus, voltages of the plurality of energy storage cells are not balanced (S2). In the battery management unit 50, a first communication unit 52 receives information transmitted from the cell monitoring unit 70, and the storage unit 55 stores the information. Then, a temporal change in voltage of each of the energy storage cells is acquired (S3). The learning model 54 determines whether or not each of the energy storage cells has deteriorated (S4). Further, the battery management unit 50 outputs a result of the determination whether or not each of the energy storage cells has deteriorated (S5). For example, the battery management unit 50 transmits information indicating the result of the determination to a client device 3 via a management device M, a communication device 1, and a communication network N. The process step sequence to determine whether or not any one of the energy storage cells has deteriorated ends here.

In this embodiment, similarly to the second or the third embodiment, based on a temporal change in voltage of each of the energy storage cells, it is possible to smoothly determine whether or not the corresponding energy storage cell has deteriorated. Further, it is possible to detect any one of the energy storage cells that has deteriorated at an earlier stage than in the conventional method. In the deterioration determination system 100, instead of the battery management unit 50, the management device M may function as the deterioration determination device.

In each of the second, the third, and the fourth embodiments, the determination is made whether or not any one of the energy storage cells has deteriorated based on the learning model. Alternatively the deterioration determination system 100 may determine whether or not any one of the energy storage cells has deteriorated without using the learning model. In this case, the deterioration determination device stops energizing each of the energy storage modules 60 and stops balancing the voltages between the plurality of energy storage cells. In this state, the deterioration determination device acquires the temporal change in voltage of each of the energy storage cells. Then, based on the temporal change in voltage of each of the energy storage cells, the deterioration determination device determines whether or not the corresponding energy storage cell has deteriorated. Each of the operations to stop energizing each of the energy storage modules 60 and to stop balancing the voltages between the energy storage cells is preferably remotely carried out (carried out via the communication network). When the voltages of the plurality of energy storage cells are not balanced, the difference in temporal change in voltage increases between the energy storage cell in the normal state and the energy storage cell that has deteriorated. Accordingly, it is possible to determine whether or not any one of the plurality of energy storage cells has deteriorated without using the learning model.

In each of the second, the third, and the fourth embodiments, the balancer circuit 71 is caused to balance the voltages between the plurality of energy storage cells. Alternatively, instead of using the balancer circuit 71, the cell monitoring unit 70 may use other methods to balance the voltages. For example, the cell monitoring unit 70 may cause an energy storage cell exhibiting a higher voltage to discharge such that an energy storage cell exhibiting a lower voltage is charged with electricity. As a result, the voltages are balanced between the energy storage cells. In each of the first, the second, and the third embodiments, each of the energy storage devices is determined as deteriorated or not. Here, each of the energy storage devices corresponds to each of the energy storage cells. Alternatively, in the deterioration determination system 100, each of the energy storage modules 60 may correspond to each of the energy storage devices to be determined; and each of the banks 4 may correspond to an energy storage device unit. In each of the second, the third, and the fourth embodiments, the energy storage system 101 includes the plurality of banks 4. Alternatively, the energy storage system 101 may include a single number of the bank 4.

As has been described above, a deterioration determination method includes steps of stopping energizing an energy storage device unit including a plurality of energy storage devices; stopping balancing voltages between the plurality of energy storage devices; acquiring a temporal change in voltage of each of the plurality of energy storage devices; and determining whether or not any one of the plurality of energy storage devices has deteriorated quickly based on the temporal change in voltage of each of the plurality of energy storage devices. The deterioration determination method may be executed by a computer program. The computer program may cause a computer to execute the deterioration determination method that includes process steps of: stopping energizing the energy storage device unit including the plurality of energy storage devices; stopping balancing the voltages between the plurality of energy storage devices; acquiring the temporal change in voltage of each of the plurality of energy storage devices; and determining whether or not any one of the plurality of energy storage devices has deteriorated quickly based on the acquired temporal change in voltage of each of the plurality of energy storage devices.

In the deterioration determination method, based on a temporal change in voltage of each of the plurality of energy storage devices in a state where the energy storage device unit including the plurality of energy storage devices is not energized and the voltages of the plurality of energy storage devices are not balanced, a learning model using supervised learning is used to determine whether or not the corresponding energy storage device has deteriorated. The deterioration determination method may be executed by the computer program.

In the deterioration determination method, the learning model undergoes machine learning based on teaching data. The teaching data includes: the temporal change in voltage of each of the energy storage devices in the state where the energy storage device unit including the plurality of energy storage devices is not energized and the voltages of the plurality of energy storage devices are not balanced; and a result of identifying whether or not the corresponding energy storage device has deteriorated. The deterioration determination method may be executed by the computer program.

The deterioration determination method further includes a step of acquiring a history of an operation of each of the plurality of energy storage devices. In the deterioration determination method, based on the temporal change in voltage of each of the plurality of energy storage devices in the state where the energy storage device unit including the plurality of energy storage devices is not energized and the voltages of the plurality of energy storage devices are not balanced, and based on the history of the operation of each of the plurality of energy storage devices, the learning model using the supervised learning is used to determine whether or not the corresponding energy storage device has deteriorated. The deterioration determination method may be executed by the computer program.

In the deterioration determination method, the learning model undergoes the machine learning based on teaching data. The teaching data includes: the temporal change in voltage of each of the energy storage devices in the state where the energy storage device unit including the plurality of energy storage devices is not energized and the voltages of the plurality of energy storage devices are not balanced; the history of the operation of each of the energy storage devices; and a result of identifying whether or not the corresponding energy storage device has deteriorated. The deterioration determination method may be executed by the computer program.

In the deterioration determination method, a determination is made whether or not any one of the energy storage devices has deteriorated in one of a plurality of the energy storage device units that are connected in parallel, and when the determination has been made in the one of the plurality of the energy storage device units, a determination is made whether or not any one of the energy storage devices has deteriorated in the other or the others of the plurality of the energy storage device units. The deterioration determination method may be executed by the computer program.

A deterioration determination device is configured to determine whether or not any one of energy storage devices has deteriorated quickly. The deterioration determination device includes: an energization stop unit configured to stop energizing an energy storage device unit including a plurality of the energy storage devices; a balancing stop unit configured to stop balancing voltages between the plurality of energy storage devices; an acquisition unit configured to acquire a temporal change in voltage of each of the plurality of energy storage devices, in a state where the energization stop unit has stopped energizing the energy storage device unit including the plurality of energy storage devices and where the balancing stop unit has stopped balancing the voltages between the plurality of energy storage devices; and a determination unit configured to determine whether or not any one of the plurality of energy storage devices has deteriorated based on the temporal change in voltage of each of the plurality of energy storage devices that the acquisition unit has acquired. Any processes that are executed by the deterioration determination device may be executed by a battery management unit 50 or a cell monitoring unit 70, each provided in a vicinity of the energy storage device unit as an energy storage system 101 or the like. Alternatively, any processes that are executed by the deterioration determination device may be executed by the battery management unit 50 and the cell monitoring unit 70. Still alternatively, any processes that are executed by the deterioration determination device may be executed by the server device 2 that is connected to the energy storage device unit via a communication network.

In the deterioration determination device, the determination unit causes a learning model using supervised learning to determine, based on the temporal change in voltage of each of the energy storage devices in the state where the energy storage device unit including the plurality of energy storage devices is not energized and the voltages of the plurality of energy storage devices are not balanced, whether or not the corresponding energy storage device has deteriorated.

A deterioration determination system includes: an energy storage device unit including a plurality of energy storage devices; a switch configured to connect and disconnect the energy storage device unit to and from a power line used to energize the energy storage device unit; a balancing unit configured to balance voltages between the plurality of energy storage devices; and a deterioration determination device configured to determine whether or not any one of the plurality of energy storage devices has deteriorated quickly. The deterioration determination device includes: a balancing stop unit configured to stop an operation of the balancing unit; an acquisition unit configured to acquire a temporal change in voltage of each of the plurality of energy storage devices, in a state where the switch has disconnected the energy storage device unit from the power line and where the balancing stop unit has stopped an operation of the balancing unit; and a determination unit configured to determine whether or not any one of the plurality of energy storage devices has deteriorated based on the acquired temporal change in voltage of each of the plurality of energy storage devices.

With the configuration described above, in the state where the energy storage device unit including the plurality of energy storage devices is not energized and the voltages of the plurality of energy storage devices are not balanced, the temporal change in voltage of each of the energy storage devices is acquired, and based on the temporal change in voltage of each of the energy storage devices, the corresponding energy storage device is determined as deteriorated or not. When the voltages of the energy storage devices are not balanced, the difference in temporal change in voltage increases between an energy storage device in a normal state and an energy storage device that has deteriorated. Accordingly based on the temporal change in voltage of each of the energy storage devices, it is possible to smoothly determine whether or not the corresponding energy storage device is the energy storage cell that has deteriorated.

With the configuration described above, the learning model using the supervised learning is used to determine whether or not each of the energy storage devices has deteriorated. Here, the teaching data includes: the temporal change in voltage of each of the energy storage devices; and the result of identifying whether or not the corresponding energy storage device has deteriorated. By using the teaching data, the learning model is caused to learn, based on the temporal change in voltage of each of the energy storage devices, to determine whether or not the corresponding energy storage device has deteriorated. By using the learning model, based on the temporal change in voltage of each of the energy storage devices over a rather short period of time, it is possible to determine whether or not the corresponding energy storage device has deteriorated.

With the configuration described above, based on the temporal change in voltage of each of the energy storage devices and a history of an operation of each of the energy storage devices, the learning model is used to determine whether or not the corresponding energy storage cell has deteriorated. Each of the energy storage devices exhibits a different behavior in accordance with the history of the operation of the corresponding energy storage device. However, the teaching data includes: the temporal change in voltage of each of the energy storage devices; the history of the operation of each of the energy storage devices; and the result of identifying whether or not the corresponding energy storage device has deteriorated. Accordingly by using the teaching data, the learning model is caused to learn to determine, based on the temporal change in voltage of each of the energy storage devices and the history of the operation of each of the energy storage devices, whether or not the corresponding energy storage device has deteriorated. By using the learning model, regardless of the history of the operation in each of the energy storage devices, it is possible to smoothly determine whether or not the corresponding energy storage device has deteriorated.

With the configuration described above, in a case of the plurality of energy storage device units, a determination is made whether or not any one of the energy storage devices has deteriorated in one of the plurality of energy storage device units. Then, when the determination has been made in the one of the plurality of the energy storage device units, a determination is made whether or not any one of the energy storage devices has deteriorated in the other or the others of the plurality of the energy storage device units. In a system including the plurality of energy storage device units, it is possible to carry out protective maintenance on the system while continuing an operation of the system.

The embodiment thereof disclosed herein is merely illustrative in all respects, and not restrictive. The scope of the present invention is defined by the appended claims. The present invention is therefore intended to embrace all changes and modifications within the meanings and scopes equivalent to the claims.

The invention claimed is:

1. A monitoring device configured to monitor an energy storage device, the monitoring device comprising:
an acquisition unit configured to acquire information regarding whether a learning model is in a first mode or in a second mode, the learning model configured to detect a state of the energy storage device; and
a change unit configured to change an operation of a balancer circuit from a predetermined state in a case where the learning model is in the first mode, the balancer circuit configured to balance a voltage of the energy storage device,
wherein the first mode comprises a learning mode, and the second mode comprises a detection mode.

2. The monitoring device according to claim 1, wherein in the case where the learning model is in the first mode, the change unit changes a threshold voltage to a larger value, the threshold voltage configured to cause the balancer circuit to balance the voltage.

3. The monitoring device according to claim 1, wherein in the case where the learning model is in the first mode, the change unit changes the operation of the balancer circuit to a stopped state.

4. The monitoring device according to claim 1, wherein in the case where the learning model is in the first mode, the change unit causes one of a plurality of energy storage cells to discharge in order to increase a voltage difference between the plurality of energy storage cells.

5. The monitoring device according to claim 1, wherein in a case where the learning model is in the second mode, the change unit causes the balancer circuit to operate in the predetermined state.

6. The monitoring device according to claim 1, wherein in a case where the learning model is in the second mode, the change unit changes the operation of the balancer circuit from the predetermined state.

7. The monitoring device according to claim 1, wherein the acquisition unit acquires from a server the information regarding whether the learning model is in the first mode or in the second mode.

8. The monitoring device according to claim 1, wherein the second mode comprises the detection mode to detect a state of the energy storage device based on the learning model that has learned.

9. The monitoring device according to claim 1, wherein the balancer circuit further comprises a series circuit of a resistor and a switch connected in parallel for each one of a plurality of energy storage cells of the energy storage device.

10. The monitoring device according to claim 9, wherein the voltages of the energy storage device are balanced via a plurality of the switches and a plurality of the resistors according to a determined maximum voltage and a minimum voltage from among the plurality of energy storage cells of the energy storage device.

11. The monitoring device according to claim 9, wherein when a voltage difference between a maximum voltage and a minimum voltage of among respective voltages of the plurality of energy storage cells is equal to or more than a threshold voltage, the switch connected in parallel to an energy storage cell, from among the plurality of energy storage cells, exhibiting the maximum voltage is turned on, to cause the energy storage cell exhibiting the maximum voltage to discharge via the resistor to balance the voltages of the energy storage device.

12. The monitoring device according to claim 9, wherein the switch comprises a transistor or a relay.

13. A monitoring method configured to monitor an energy storage device, the monitoring method comprising:
    acquiring information regarding whether a learning model is in a first mode or in a second mode, the learning model configured to detect a state of the energy storage device; and
    changing an operation of a balancer circuit from a predetermined state in a case where the learning model is in the first mode, the balancer circuit configured to balance a voltage of the energy storage device,
    wherein the first mode comprises a learning mode, and the second mode comprises a detection mode.

14. The monitoring method according to claim 13,
    wherein the detection mode detects a state of the energy storage device based on the learning model that has learned, and
    wherein the balancer circuit further comprises a series circuit of a resistor and a switch connected in parallel for each one of a plurality of energy storage cells of the energy storage device.

15. The monitoring method to claim 14, wherein when a voltage difference between a maximum voltage and a minimum voltage of among respective voltages of a plurality of energy storage cells is equal to or more than a threshold voltage, the switch connected in parallel to a energy storage cell, from among the plurality of energy storage cells, exhibiting the maximum voltage is turned on, to cause the energy storage cell exhibiting the maximum voltage to discharge via the resistor to balance the voltages of the energy storage device.

16. A computer program, stored in a non-transitory computer readable medium, configured to cause a computer to cause a learning model regarding an energy storage device to learn, wherein the computer executes:
    acquiring information regarding whether the learning model is in a first mode or in a second mode;
    changing an operation of a balancer circuit from a predetermined state in a case where the learning model is in the first mode, the balancer circuit configured to balance a voltage of the energy storage device; and
    acquiring input data, including at least one of a voltage, a current, a temperature, and a state of charge (SOC) of the energy storage device, to provide the input data to the learning model,
    wherein the first mode comprises a learning mode, and the second mode comprises a detection mode.

17. The computer program according to claim 16, wherein the computer further executes in the case where the learning model is in the first mode, acquiring the input data to provide the input data to the learning model while leaving the operation of the balancer circuit in the predetermined state.

18. A computer program, stored in the non-transitory computer readable medium, configured to cause a computer to detect a state of an energy storage device, wherein the computer executes:
    inputting input data, including at least one of a voltage, a current, a temperature, and a state of charge (SOC) of the energy storage device, to a learning model that has learned based on the computer program according to claim 16, and
    detecting the state of the energy storage device.

19. The computer program according to claim 16,
    wherein the detection mode detects a state of the energy storage device based on the learning model that has learned,
    wherein the balancer circuit further comprises a series circuit of a resistor and a switch connected in parallel for each one of a plurality of energy storage cells of the energy storage device, and
    wherein the voltages of the energy storage device are balanced via a plurality of the switches and a plurality of the resistors according to a determined maximum voltage and a minimum voltage from among the plurality of energy storage cells of the energy storage device.

* * * * *